United States Patent [19]
Kuge et al.

[11] Patent Number: 5,969,420
[45] Date of Patent: Oct. 19, 1999

[54] SEMICONDUCTOR DEVICE COMPRISING A PLURALITY OF INTERCONNECTION PATTERNS

[75] Inventors: Shigehiro Kuge; Kazutami Arimoto; Masaki Tsukude; Kazuyasu Fujishima, all of Hyogo, Japan

[73] Assignee: Mitsubushi Denki Kabushiki Kaisha, Tokyo, Japan

[21] Appl. No.: 08/881,397

[22] Filed: Jun. 24, 1997

Related U.S. Application Data

[63] Continuation of application No. 08/683,146, Jul. 18, 1996, abandoned, which is a continuation of application No. 08/376,200, Jan. 20, 1995, abandoned.

[30] Foreign Application Priority Data

Jan. 20, 1994 [JP] Japan ................................. 6-004621
Jul. 5, 1994 [JP] Japan ................................. 6-153368

[51] Int. Cl.⁶ .................................................. H01L 23/48
[52] U.S. Cl. .......................... 257/758; 257/204; 257/206; 257/207; 257/208; 257/211; 257/750; 257/758; 257/763
[58] Field of Search .................................... 257/204, 206, 257/207, 208, 211, 382, 383, 384, 750, 758, 763

[56] References Cited

U.S. PATENT DOCUMENTS

| 5,060,045 | 10/1991 | Owada et al. | 257/211 |
| 5,119,169 | 6/1992 | Kozono et al. | 257/758 |

FOREIGN PATENT DOCUMENTS

| 0067674 | 3/1992 | Japan | 257/207 |
| 0355952 | 12/1992 | Japan | 257/207 |
| 5-3298 | 1/1993 | Japan . | |
| 5-36932 | 2/1993 | Japan . | |
| 0152291 | 6/1993 | Japan | 257/207 |

OTHER PUBLICATIONS

"Switched–Source–Impedance CMOS Circuit For Low Standby Subthreshold Current Giga–Scale LSI's", Horiguchi et al., 1993 Symposium on VLSI Circuit Dig. of tech Papers. pp. 47–48.

"Standby/Active Mode Logic for Sub–1 V 1G/4Gb DRAMs", Takashima et al., 1993 Symposium on VLSI Circuit Dig. of Tech Papers. pp. 83–84.

"A 34NS 16MB DRAM With Controllable Voltage Down Concertor", Arimoto et al., ESSCIRS Proceedings Sep. 1991, pp. 21–24.

Primary Examiner—Peter Toby Brown
Assistant Examiner—Edwin Oh
Attorney, Agent, or Firm—McDermott, Will & Emery

[57] ABSTRACT

On transistors P1, P2, N1 and N2 constituting an NAND gate, interconnection pattern W of metal having high melting point and aluminum interconnection patterns Al1 and Al2 are stacked. A local line LL for connecting transistors P1, P2, N1 and N2 to each other is formed by the interconnection pattern W of metal having high melting point, signal lines SL and SL' for signal input/output between the NAND gate and the outside are formed by aluminum interconnection pattern Al1, and power supply lines VL and VL' for applying power supply potentials Vcc and Vss to the NAND gate are formed by the aluminum interconnection pattern Al2. As compared with the prior art in which the local line LL is formed by the aluminum interconnection pattern Al1, the degree of freedom in layout can be improved and the layout area can be reduced.

12 Claims, 27 Drawing Sheets

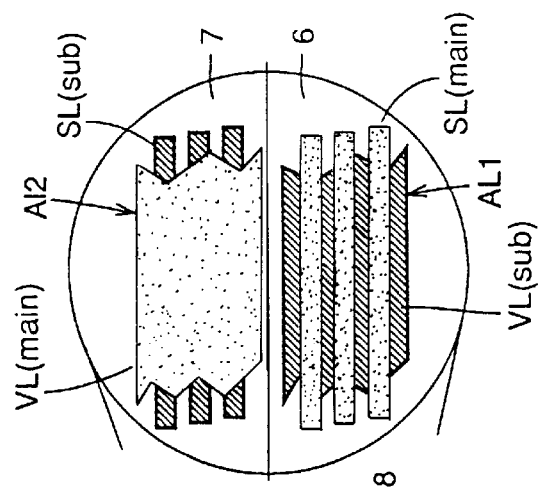
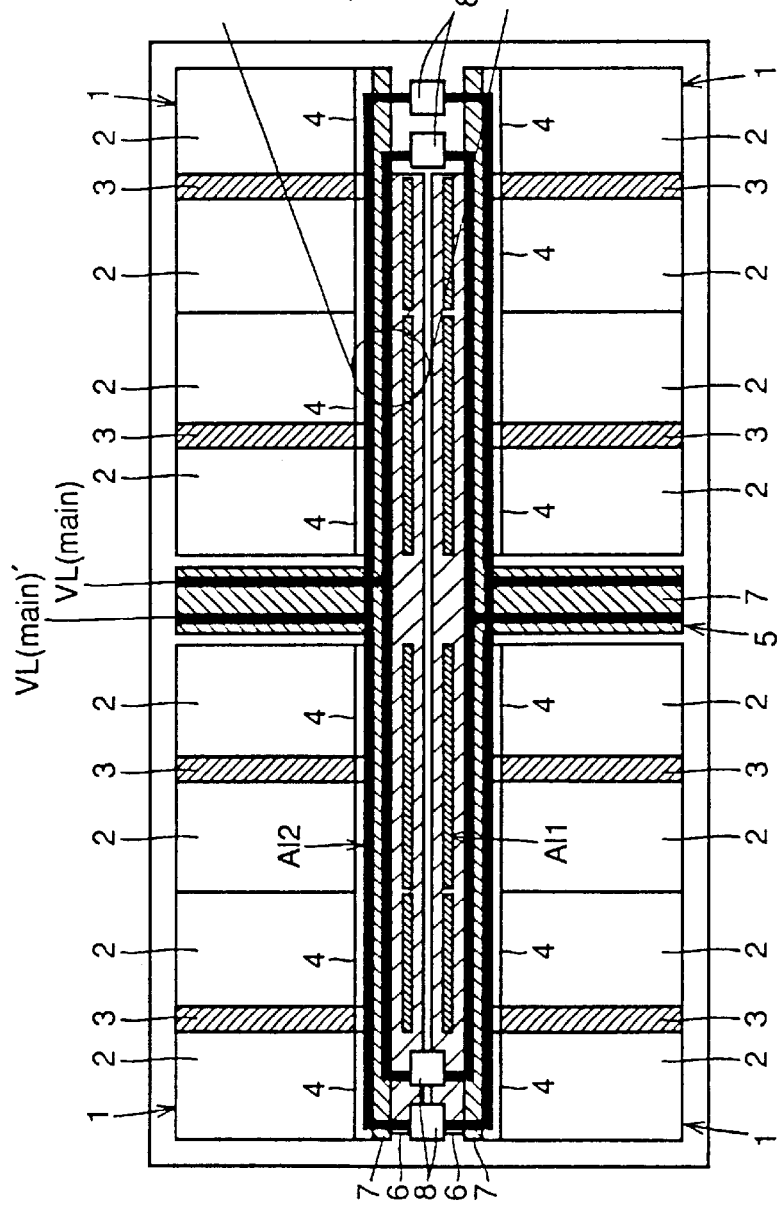

SEMICONDUCTOR DEVICE COMPRISING A PLURALITY OF INTERCONNECTION PATTERNS

This application is a continuation of application Ser. No. 08/683,146 filed Jul. 18, 1996 now abandoned, which is a continuation of application Ser. No. 08/376,200 filed Jan. 20, 1995 now abandoned.

BACKGROUND OF THE INVENTION

1. Field of the Invention

The present invention relates to a semiconductor integrated circuit. More specifically, the present invention relates to a semiconductor integrated circuit including a plurality of semiconductor element groups each having prescribed function, and first, second and third interconnection patterns stacked successively on the plurality of semiconductor element groups.

2. Description of the Background Art

In a semiconductor memory of mega bit order, especially in dynamic random access memories (hereinafter referred to as DRAMs), memory array architecture employing two layers of aluminum interconnection patterns Al1 and Al2 is dominant, as described in ESSCIRC PROCEEDINGS, September 1991 pp. 21–24.

FIG. 25 is a block diagram showing a structure of a conventional DRAM chip. Referring to the figure, the DRAM chip includes a plurality of memory array regions 31 and peripheral circuit region 32 provided between the memory array regions. Each memory array region 31 includes a plurality of sub arrays 33 arranged in the row direction, a plurality of sense amplifier bands 34 provided between and at opposite ends of sub arrays 33, a row decoder 35 and a column decoder 36. Peripheral circuit region 32 includes a plurality of NAND gates, NOR gates and the like.

The DRAM chip is, specifically, formed of a silicon substrate, a plurality of transistors and capacitors formed on the surface of the silicon substrate, and an interconnection pattern W of metal having high melting point and aluminum interconnection patterns Al1 and Al2 stacked successively thereon.

FIG. 26 shows an example of a specific structure of the memory array region 31 of the DRAM chip shown in FIG. 25, which is a partial plan view showing the configuration of the sub array 33 and sense amplifier band 34. Referring to the figure, sub array 33 employs folded bit line structure and includes a plurality of memory cells MC arranged in the directions of rows and columns, and sense amplifier band 34 includes a plurality of sense amplifiers 34a provided corresponding to respective columns. In this region, the first layer of the high melting point metal interconnection pattern W is used as bit lines BL and /BL for connecting memory cells MC of each column to a sense amplifier 34a. The second layer, that is, the aluminum interconnection pattern Al1 is used as a part of a word line WL, and serves as a shunt for reducing time constant of the word line WL. The third layer, that is, the aluminum interconnection pattern Al2 is used as a column selection line CSL for transmitting an output from column decoder 36.

Bit lines BL and /BL are formed of the interconnection pattern W of metal having high melting point, in order to prevent migration of the material of bit lines BL and /BL to the silicon substrate. As the metal having high melting point, tungsten silicide (WSi) is used, as an example.

Though bit lines BL and /BL must have low resistance so as to increase the speed of data reading, what is more desirable is to reduce capacitance of the bit lines BL and /BL themselves to reduce power consumption, to increase the amount of read signal from memory cell MC so as to ensure operation margin, and to reduce capacitance between bit lines BL and /BL to reduce noise between bit lines BL and /BL, and therefore bit lines BL and /BL, that is, the interconnection pattern W of metal having high melting point, is made thin.

FIG. 27 shows an example of a specific structure of peripheral circuit region 32 of the DRAM chip shown in FIG. 25, and it is a partial plan view showing the layout of an area including a 2-input CMOS-NAND gate (hereinafter simply referred to as an NAND gate). FIG. 28 is an enlarged view of a main portion of FIG. 27. Referring to the figure, the NAND gate includes P channel MOS transistors P1 and P2 and N channel MOS transistors N1 and N2 arranged in two rows and two columns, and each of the transistors P1, P2, N1 and N2 includes a gate G extending in the Y direction in the figure and a source S and a drain D provided at opposing sides thereof. At one end of the gate G of each of the transistors P1, P2, N1 and N2, there is provided a pad PD, and pads PD of P channel MOS transistors P1 and P2 and pads PD of N channel MOS transistors N1 and N2 are provided adjacent to each other.

The third layer, that is, aluminum interconnection pattern Al2 used as the column selection line CSL in memory array region 31 is used in peripheral circuit region 32, as power supply lines VL and VL' and signal lines SL1, SL2, . . . ; SL1', SL2', . . . , extending in the X direction in the figure. Power supply line VL is provided to cover a P region in which two P channel MOS transistors P1 and P2 are arranged, and to the power supply line VL, power supply potential Vcc (H level) is applied. Power supply line VL' is provided to cover an N region in which two N channel MOS transistors N1 and N2 are arranged, and to the power supply line VL', power supply potential Vss (L level) is applied.

Signal lines SL1, SL2, . . . are provided outward from power supply line VL with a prescribed pitch therebetween, and these lines are used for signal input/output between the NAND gate portion and the outside. Signal lines SL1', SL2', . . . are provided outward from power supply line VL' with a prescribed pitch, and they are used for signal input/output between the NAND gate and the outside.

The second layer, that is, the aluminum interconnection pattern Al1 used as the shunt of word line WL in memory array region 31 is used, in this region, as a local line LL for internal connection of NAND gate.

More specifically, P channel MOS transistors P1 and P2 have their sources connected to local lines LL2 and LL3, respectively, through contact holes CH, while local lines LL2 and LL3 are connected via through holes TH to power supply line VL. P channel MOS transistors P1 and P2 and N channel MOS transistor N1 have their drains D connected to local line LL4 through contact holes CH, and local line LL4 is connected to signal line SL1', for example, via a through hole TH. Signal line SL1' serves as an output signal line for the NAND gate.

The source S of N channel MOS transistor N1 and the drain D of N channel MOS transistor N2 are commonly connected to local line LL5 through contact holes CH. N channel MOS transistor N2 has its source connected to local line LL6 through a contact hole CH, and local line LL6 is connected to power supply line VL' via a through hole TH.

P channel MOS transistor P1 and N channel MOS transistor N1 have their gates G commonly connected to local line LL1 through pads PD and contact holes CH, and local line LL1 is connected to signal line SL2, for example, via through hole TH. Signal line SL2 serves as one input signal line A of the NAND gate.

P channel MOS transistor P2 and N channel MOS transistor N2 have their gates G commonly connected to local line LL7 through pads PD and contact holes CH, and local line LL7 is connected to signal line CL3', for example, via through hole TH. Signal line SL3' serves as the other input signal line B of the NAND gate.

Transistors P1, P2, N1 and N2 constitute an electric circuit such as shown in FIG. 29, that is, a NAND gate generally represented by such signs as shown in FIG. 30.

In the conventional DRAM chip, the first layer, that is, the interconnection pattern W of metal having high melting point is used as bit lines BL and /BL in the memory array region 31, while it is hardly utilized in the peripheral circuit region 32. The reason for this is that the conventional interconnection pattern W of metal having high melting point which is formed of tungsten silicide (WSi) has high sheet resistance, resulting in significant signal delay when it is used as the local line LL for connecting transistors P1, P2, N1 and N2 between each other.

However, recently, interconnection pattern W of metal having high melting point having relatively small sheet resistance as compared with the conventional pattern has come to be available. Specific example of the material includes tungsten (W) and titanium silicide (TiSi). By using the interconnection pattern W of metal having high melting point formed of such material as the lines in peripheral circuit region 32, the problem of signal delay can be solved. Accordingly, a new layout utilizing the interconnection pattern w of metal having a high melting point, which has been used only as the bit lines BL and /BL in the prior art, becomes possible.

SUMMARY OF THE INVENTION

Therefore, an object of the present invention is to provide a semiconductor integrated circuit having higher degree of freedom in layout, smaller layout area, smaller resistance of power supply lines, and small coupling noise of signal lines.

Briefly stated, in the present invention, among first, second and third interconnection patterns stacked on a plurality of semiconductor element groups, the first interconnection pattern is used as a local lines for connecting semiconductor elements in each of the semiconductor element groups.

Therefore, according to the present invention, the second interconnection pattern which has been conventionally used as the local lines can be freely used as the lower layer signal lines or lower layer power supply lines, and the third interconnection patterns can be freely used as upper layer signal lines or upper layer power supply lines. This significantly increases the degree of freedom of layout, and reduces the layout area.

According to a preferred embodiment of the present invention, the second interconnection pattern is used as lower layer signal line for signal input/output between each of the semiconductor element groups and the outside, and the third interconnection pattern is used as upper layer power supply lines for applying a power supply potential to each of the semiconductor element groups. More preferably, the second interconnection pattern is used as a contact electrode for connecting the upper layer power supply line and each of the semiconductor element groups.

According to another preferred embodiment of the present invention, the second interconnection pattern is used as lower layer power supply lines for applying the power supply potential to each of the semiconductor element groups, and the third interconnection pattern is used as upper layer signal lines for signal input/output between each of the semiconductor element groups and the outside. More preferably, the lower layer power supply line is provided to cover local lines. More preferably, the second interconnection pattern is further used as contact electrodes for connecting the upper layer signal lines and each of the semiconductor element groups.

According to a more preferred embodiment of the present invention, the second and third interconnection patterns are used as the lower and upper signal lines, respectively, for signal input/output between each of the semiconductor element groups and the outside. More preferably, the upper and lower signal lines are so provided that they do not at least partially overlap with each other.

According to a more preferred embodiment of the present invention, the second and third interconnection patterns are used as lower and upper power supply lines, respectively, for applying a power supply potential to each of the semiconductor element groups.

According to a still further preferred embodiment of the present invention, the first, second and third interconnection patterns are formed of aluminum.

According to a still further preferred embodiment of the present invention, the first interconnection pattern is formed of a metal having high melting point such as tungsten, and the second and third interconnection patterns are formed of aluminum.

According to a still further preferred embodiment of the present invention, each of the plurality of semiconductor element groups includes a plurality of semiconductor elements of first and second conductivity types, and the first interconnection pattern connect the semiconductor elements of the first conductivity type between each other in each of the semiconductor element groups.

According to a still further preferred embodiment of the present invention, the semiconductor integrated circuit includes a plurality of memory cells arranged in rows and columns on a surface of a semiconductor substrate, and the first interconnection pattern is further used as bit lines provided corresponding to each of the memory cell columns.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 17A is a block diagram showing a structure of a DRAM chip in accordance with a seventh embodiment, and FIG. 17B is an enlarged view of the main portion thereof.

DESCRIPTION OF THE PREFERRED EMBODIMENTS

[Embodiment 1]

Figure 1:
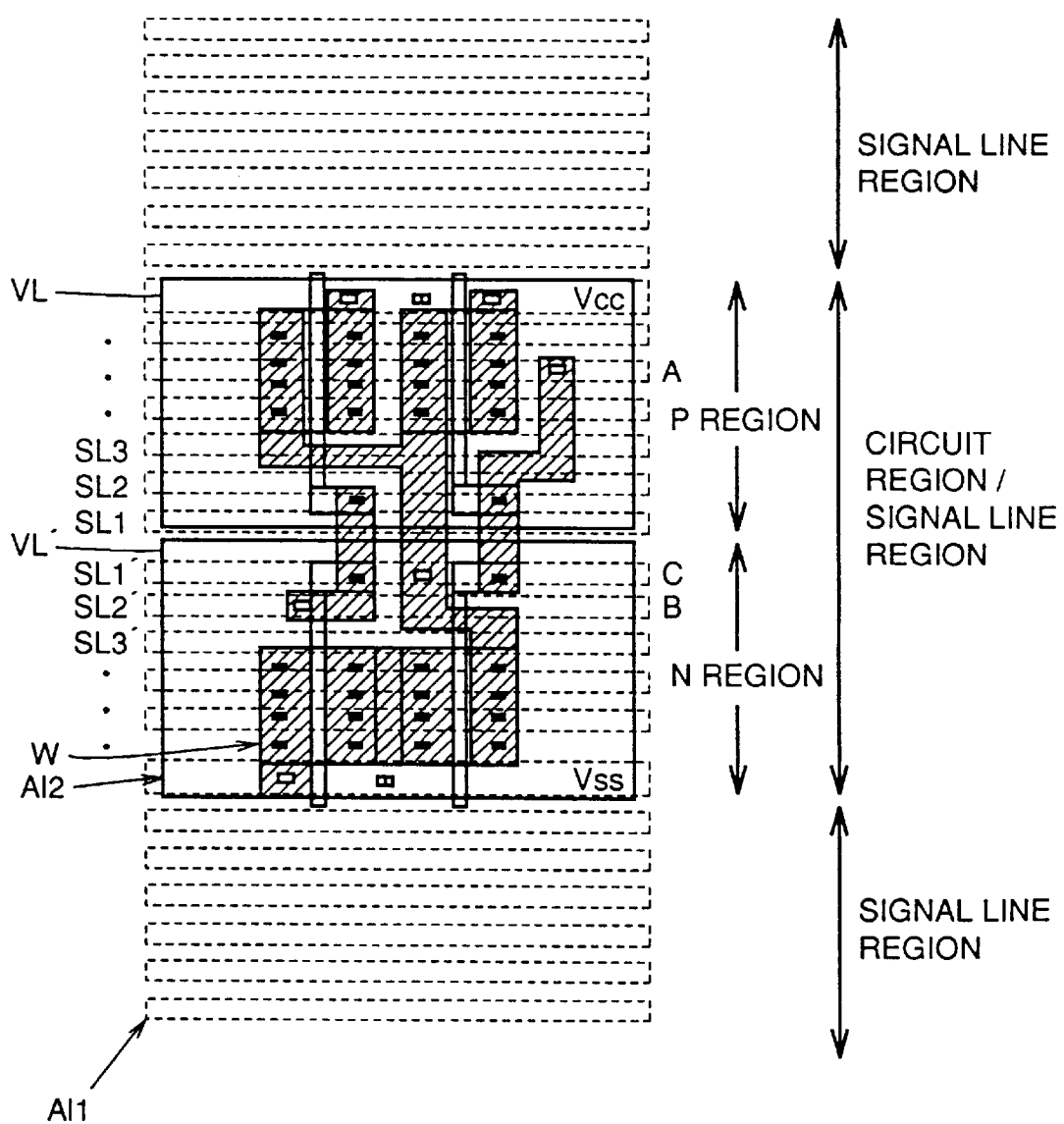
FIG. 1 is a partially fragmented plan view showing layout of an area including a NAND gate, in a peripheral circuit region of a DRAM chip in accordance with a first embodiment of the present invention.
Figure 2:
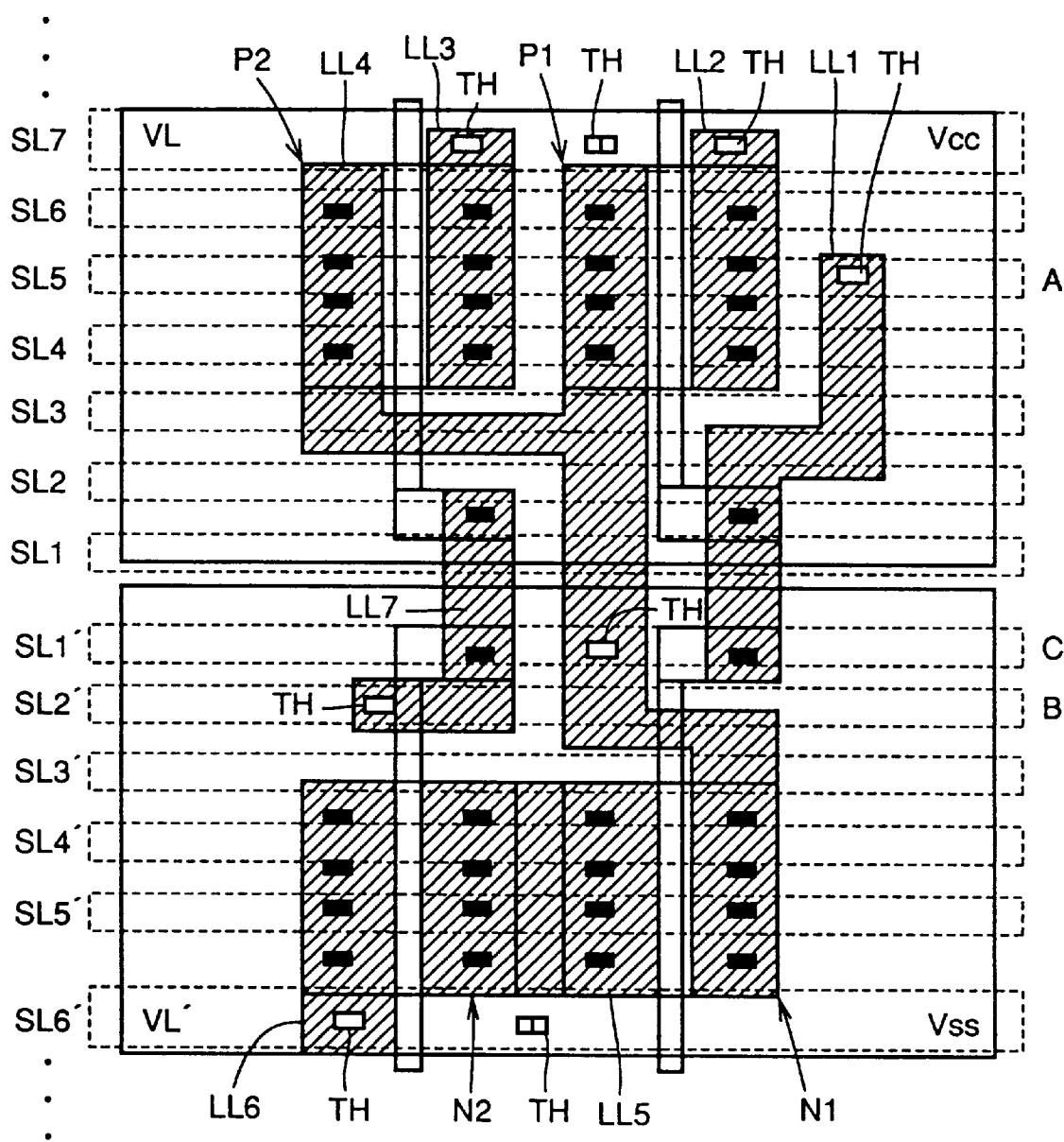
FIG. 2 is an enlarged view of a main portion of the area including the NAND gate shown in FIG. 1.
Figure 3:
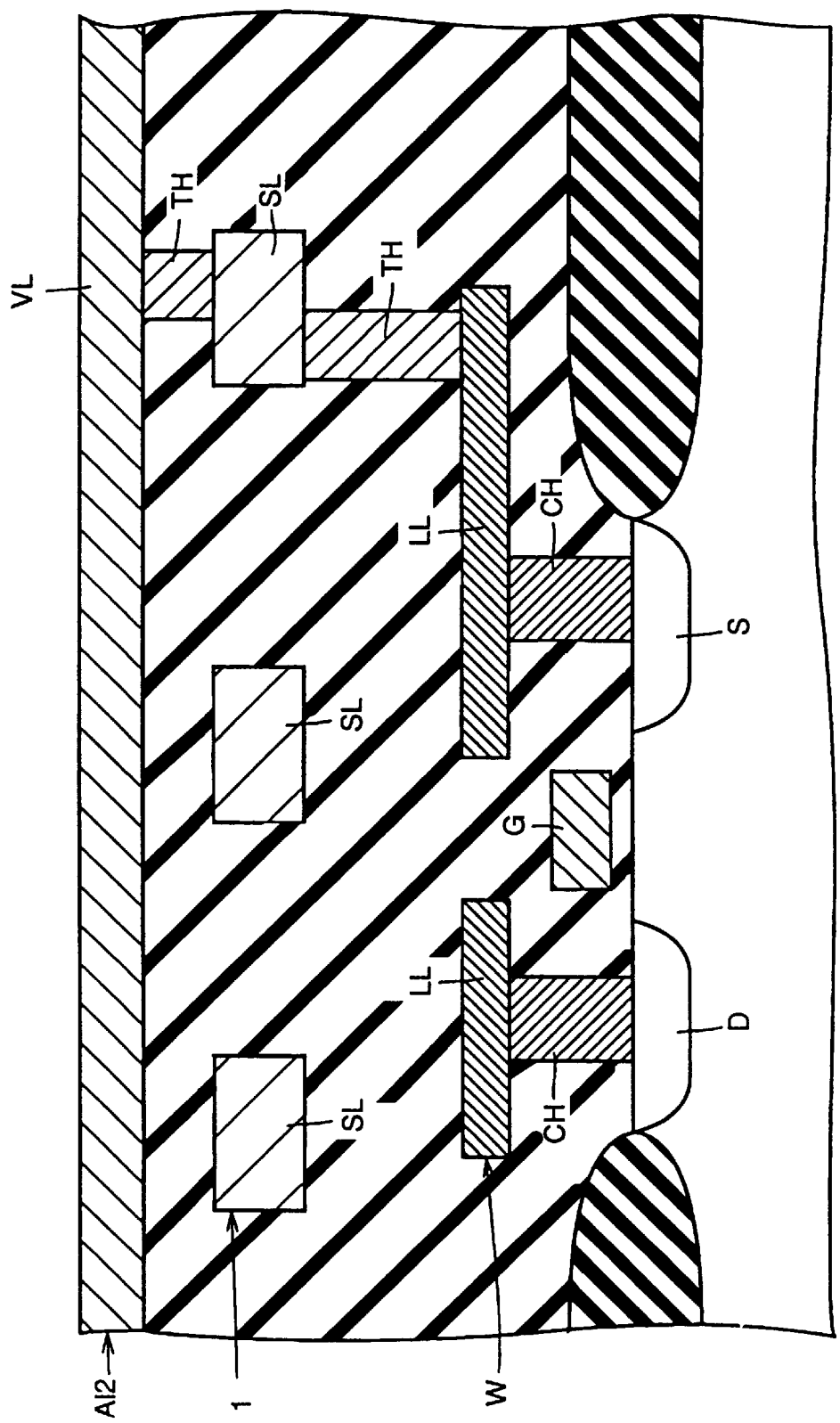
FIG. 3 is a cross sectional view of a main portion of the area including the NAND gate shown in FIG. 1.
Figure 25:
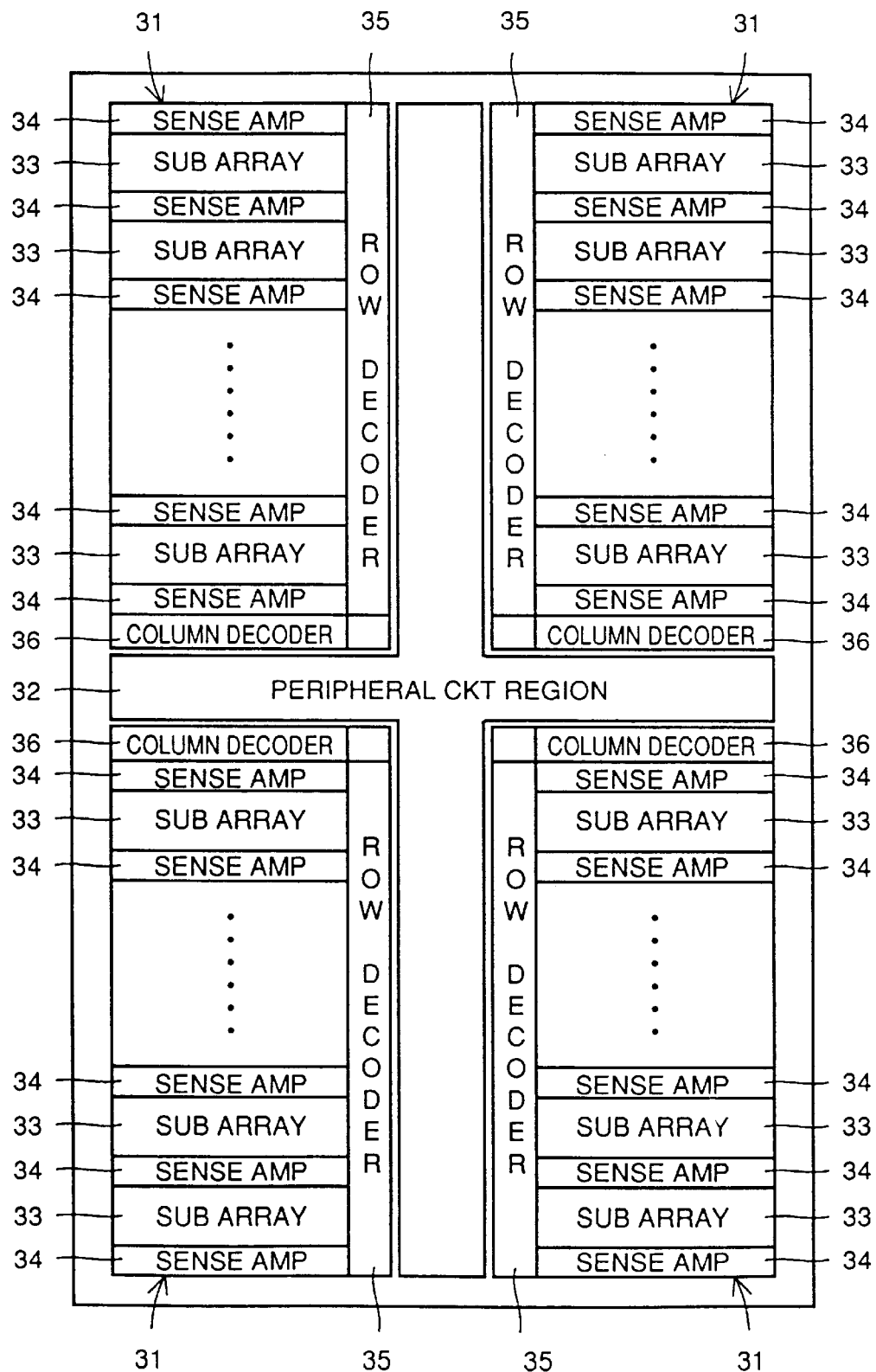
FIG. 25 is a block diagram showing a structure of a conventional DRAM chip.
Figure 26:
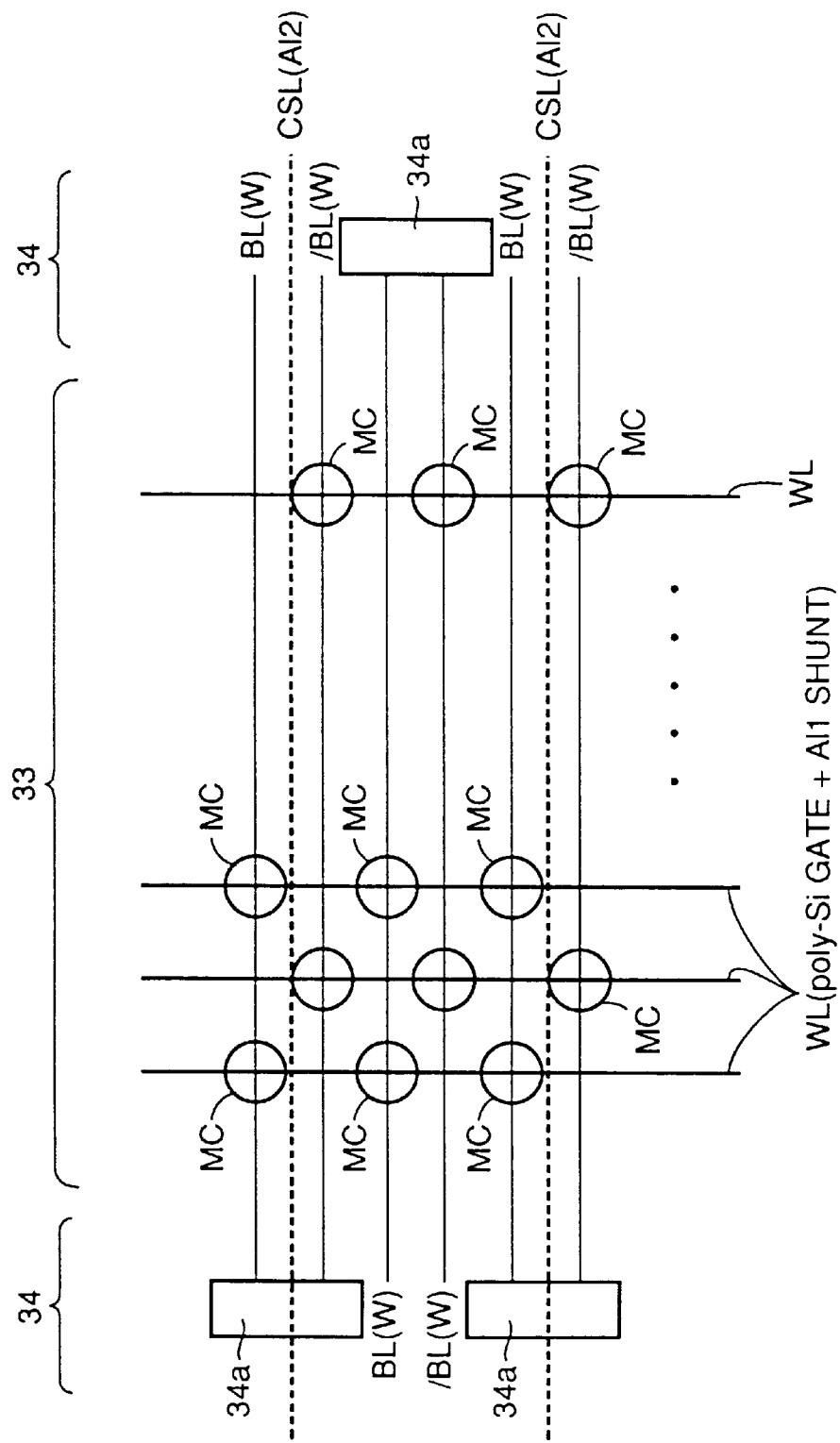
FIG. 26 is a partial plan view showing a structure of a memory array region of the DRAM chip shown in FIG. 25.

FIG. 1 is a partially fragmented plan view showing layout of an area including a NAND gate of a peripheral circuit region 32 of a DRAM chip in accordance with a first embodiment of the present invention, FIG. 2 is an enlarged view of a main portion thereof, and FIG. 3 is a cross section of the main portion thereof. Since the structure of memory array region 31 of the DRAM chip is the same as that of the conventional DRAM chip shown in FIGS. 25 and 26, description thereof is not repeated.

Referring to the figure, the NAND gate includes, as in the prior art, P channel MOS transistors P1 and P2 and N channel MOS transistors N1 and N2, arranged in two rows and two columns. The third layer, that is, aluminum interconnection pattern Al2 used as the column selecting line CSL in memory array region 31 of the DRAM chip, is used in this region, as power supply lines VL and VL'. Power supply line VL is provided to cover the P region, and to the power supply line VL, power supply potential Vcc is applied. Power supply line VL' is provided to cover the N region, and to the power supply line VL', power supply potential Vss is applied.

The second layer, that is, aluminum interconnection pattern Al1 used as the shunt of word line WL in memory array region 31 is used as signal lines SL1, SL2, . . . ; SL1', SL2', . . . in this region. Signal lines SL, SL2, . . . are arranged with a prescribed pitch toward the P region viewed from the boundary between the P and N regions, while signal lines SL1', SL2', . . . are arranged with a prescribed pitch toward the N region, viewed from the boundary between the P and N regions. Of these lines, signal lines SL1 to SL7 are provided on P region, while signal lines SL1' to SL6 are provided on the N region. Signal lines SL7 and SL6' are used as contact electrodes for connecting the power supply lines VL and VL' with the NAND gate, as will be described later.

The first layer, that is, interconnection layer W of metal having high melting point used as bit lines BL and /BL in memory array region 31 is used, in this region, as a local line LL for connecting transistors P1, P2, N1 and N2 to each other, connecting transistors P1, P2, N1 and N2 to power supply lines VL and VL', and connecting transistors P1, P2, N1 and N2 to signal lines SL1, SL2, . . . ; SL1', SL2', . . . . The interconnection pattern W of metal having high melting point has such a structure that allows connection to both of the P$^+$ diffusion region on which P channel MOS transistors P1 and P2 are formed and N$^+$ diffusion region on which N channel MOS transistors N1 and N2 are formed.

More specifically, P channel MOS transistors P1 and P2 have their sources S connected to local lines LL2 and LL3, respectively, through contact holes CH, and local lines LL2 and LL3 are connected to signal line SL7 via a through holes TH, and signal line SL7 is connected to power supply line VL via through hole TH. P channel MOS transistors P1 and P2 and N channel MOS transistor N1 have their drains connected to local line LL4 through contact holes CH, and local line LL4 is connected to signal line SL1', for example, via a through hole TH. Signal line SL1' serves as an output signal line C of the NAND gate.

The source S of N channel MOS transistor N1 and drain D of N channel MOS transistor N2 are commonly connected to local line LL5 through contact holes CH. N channel MOS transistor N2 has its source S connected to local line LL6 through contact hole CH, local line LL6 is connected to signal line SL6' via through hole TH, and signal line SL6' is connected to power supply line VL' via through hole TH.

P channel MOS transistor P1 and N channel MOS transistor N1 have their gates G commonly connected to local line LL1 through pads PD and contact holes CH, and local line LL1 is connected to signal line SL5 via a through hole TH. Therefore, signal line SL5 serves as one input signal line A of the NAND gate.

P channel MOS transistor P2 and N channel MOS transistor N2 have their gates connected to local line LL7 through pads PD and contact holes CH, and local line LL7 is connected to signal line SL2', for example, via a through hole TH. Therefore, signal line SL2' serves as the other input signal line B of the NAND gate.

In this embodiment, signal lines SL1, SL2, . . . ; SL1', SL2', . . . are also arranged on the circuit region (P and N regions), and therefore the layout area can be significantly reduced as compared with a conventional layout shown in FIG. 27. Further, the distance of cross-under connecting terminals of transistors P1, P2, N1 and N2 with signal lines SL and SL' can be shortened.

Figure 4:
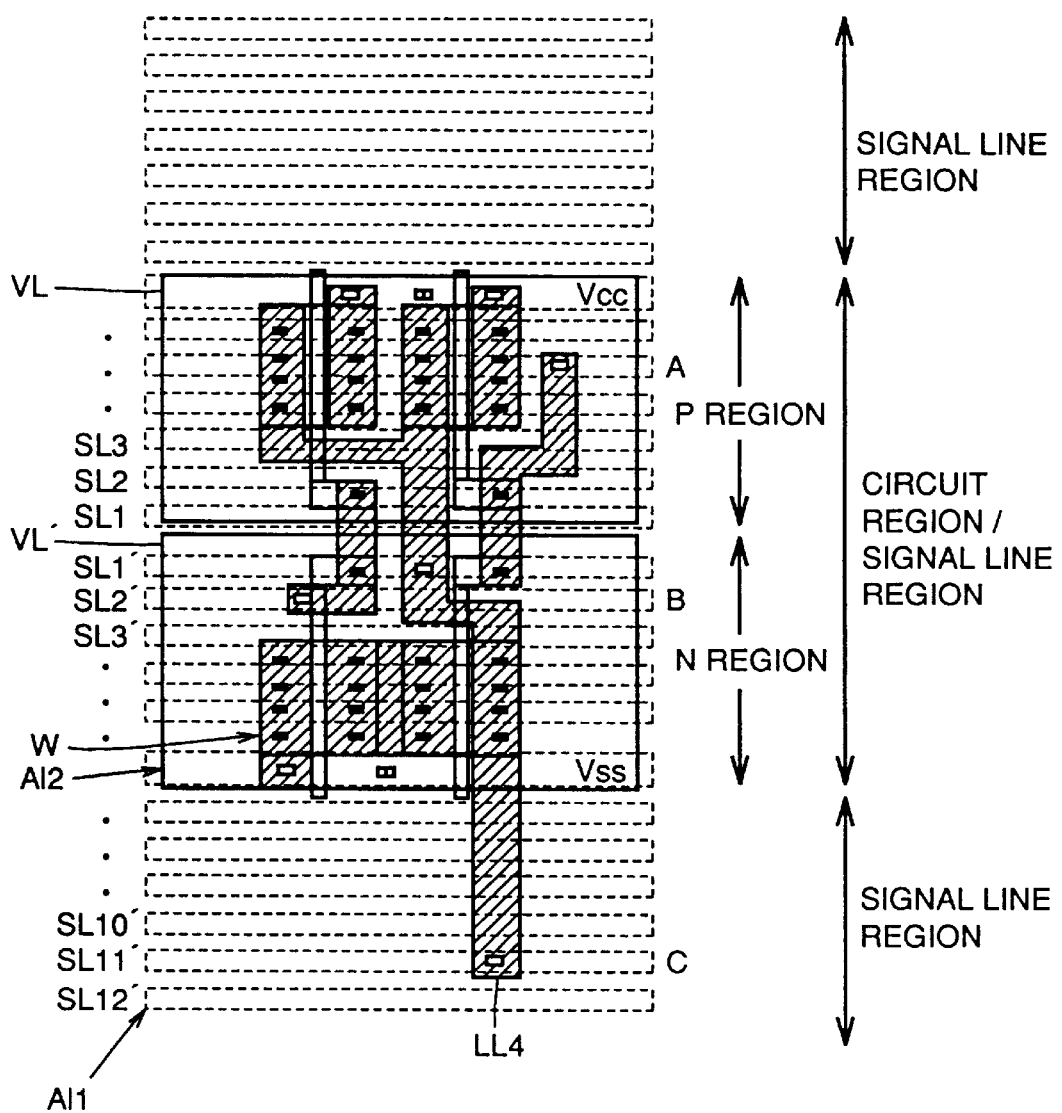
FIG. 4 is a partially fragmented plan view showing an improvement of the first embodiment.

Meanwhile, one end of local line LL may be extended outside the circuit region and connected to signal line SL11', for example, as shown in FIG. 4. As described above, in this embodiment, arrangement of transistors P1, P2, N1 and N2 and input/output signal lines A, B and C are not limited at all, and they can be laid-out freely.

In FIGS. 1 to 4, the width of power supply lines VL and VL' is shown as approximately the same as the width of the circuit region. However, the width of power supply lines may be widened to the outside of the circuit regions and over the signal line regions. In that case, electric resistance of power supply lines VL, VL' is reduced.

[Embodiment 2]

Figure 5:
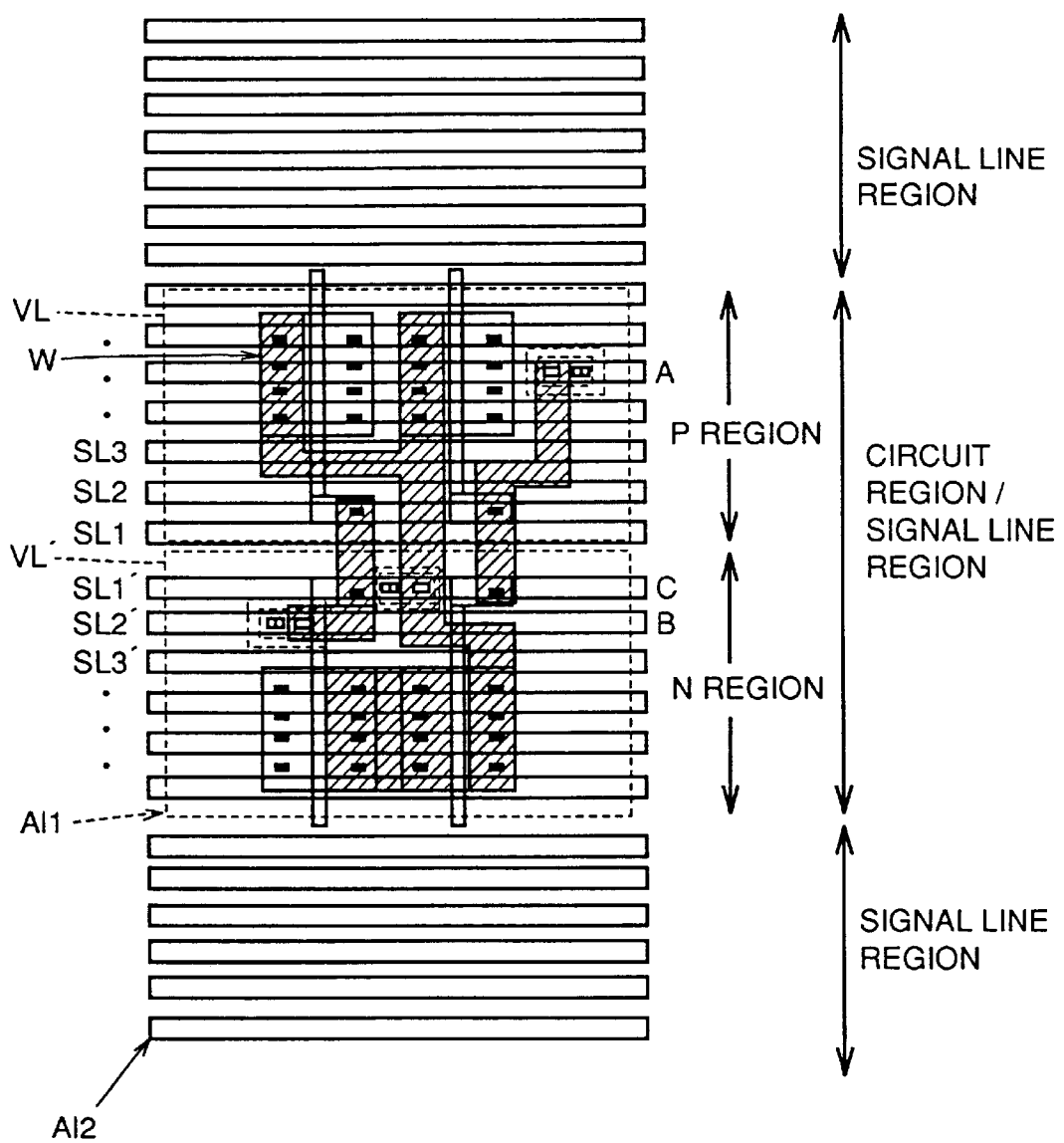
FIG. 5 is a partially fragmented plan view showing layout of an area including a NAND gate in a peripheral circuit region of a DRAM chip in accordance with a second embodiment of the present invention.
Figure 6:
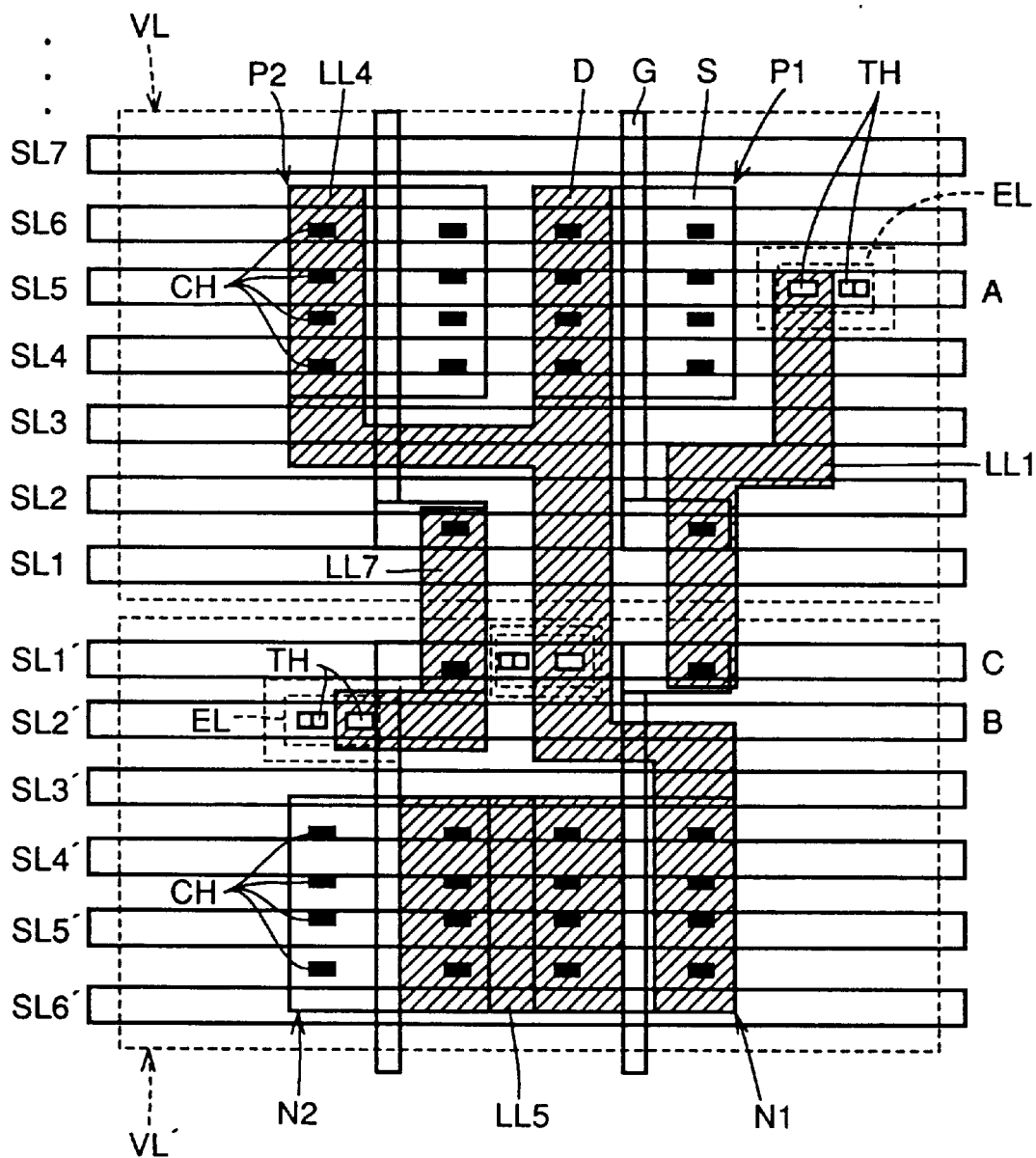
FIG. 6 is an enlarged view of a main portion of the area including the NAND gate shown in FIG. 5.
Figure 7:
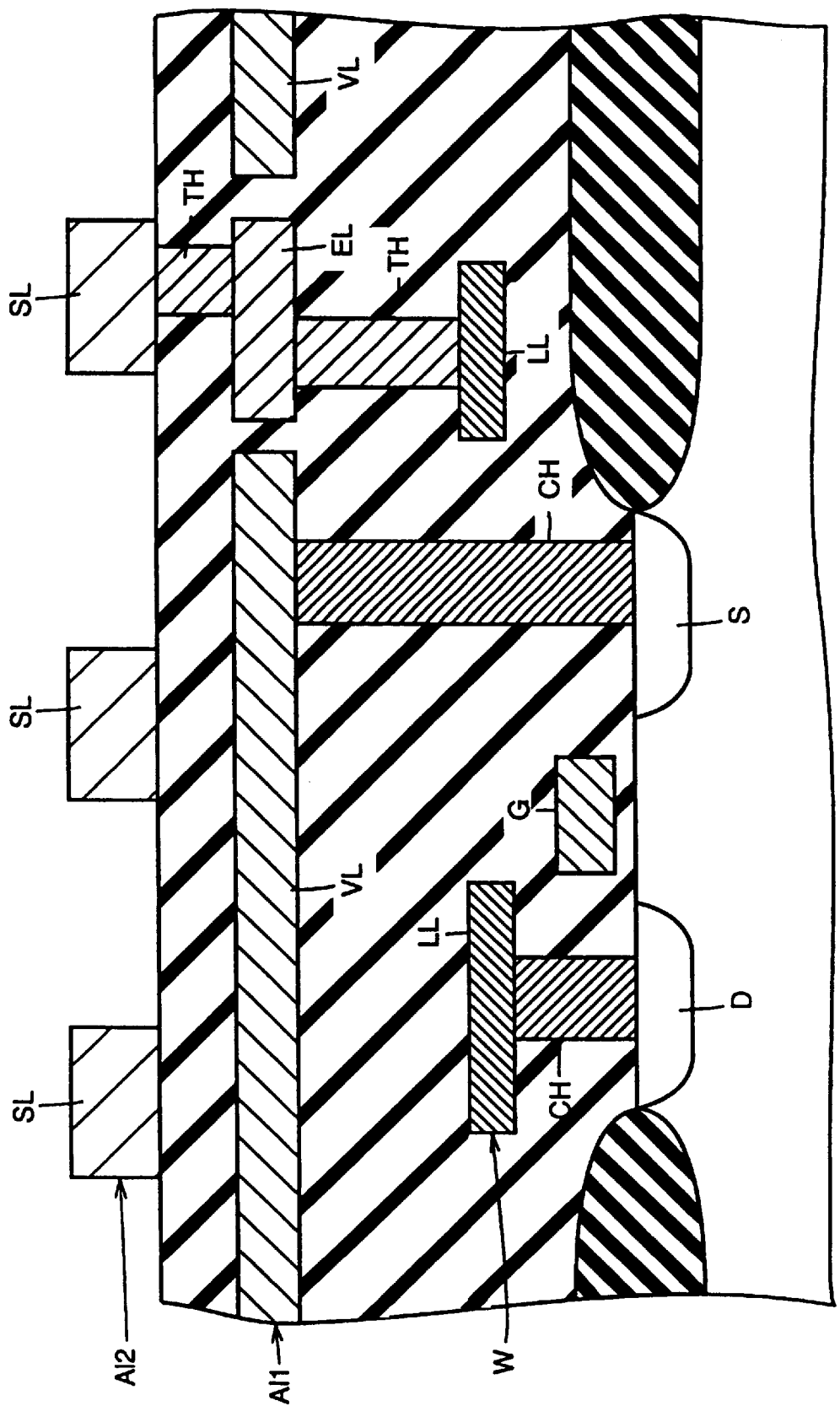
FIG. 7 is a cross section of a main portion of the area including the NAND gate shown in FIG. 5.

FIG. 5 is a partially fragmented plan view showing layout of the area including the NAND gate in peripheral circuit region 32 of the DRAM chip in accordance with the second embodiment of the present invention, FIG. 6 is an enlarged view of the main portion, and FIG. 7 is a cross section of the main portion thereof. The NAND gate includes, as in the prior art example, P channel MOS transistors P1 and P2 and N channel MOS transistors N1 and N2 arranged in two rows and two columns.

The third layer, that is, aluminum interconnection pattern Al2 used as the column selecting line CSL in memory array region 31 of the DRAM chip is used, in this region, as signal lines SL1, SL2, . . . ; SL1', SL2', . . . . Signal lines SL1, SL2, . . . are arranged with a prescribed pitch toward the P region viewed from the boundary between the P and N regions, while signal lines SL1', SL2', . . . are arranged at a prescribed pitch toward the N region viewed from the boundary between the P and N regions. Signal lines SL1 to SL7 are provided on the P region, while the signal lines SL1' to SL6' are provided on the N region.

The second layer, that is, the aluminum interconnection pattern Al1 used as the shunt of the word lines WL in memory array region 31 is used, in this region, as power supply lines VL and VL' and contact electrode EL. Power supply line VL is provided to cover the P region, and power supply potential Vcc is applied to the power supply line VL. Power supply line VL' is provided to cover the N region and the power supply potential Vss is applied to power supply line VL'. There are a plurality of contact electrodes EL provided on the circuit region, with the periphery thereof insulated from power supply lines VL and VL'. These are used for connection between any of the signal lines SL and SL' and the local line LL.

The first layer, that is, the interconnection pattern W of metal having high melting point used as the bit line BL in memory array region 31 is used as local line LL for connecting transistors P1, P2, N1 and N2 with each other. The interconnection pattern W of metal having high melting point has such a structure that allows connection to both $P^+$ diffusion region for P channel MOS transistors P1 and P2 and $N^+$ diffusion region for N channel MOS transistors N1 and N2.

More specifically, P channel MOS transistors P1 and P2 have their sources directly connected to power supply line VL through contact holes CH, and N channel MOS transistor N2 has its source directly connected to power supply line VL' through a contact hole CH. P channel MOS transistors P1 and P2 and N channel MOS transistor N1 have their drains connected to local line LL4 through contact holes CH, local line LL4 is connected to contact electrode EL via a through hole TH, and contact electrode EL is connected to signal line SL1', for example, via a through hole TH. Therefore, signal line SL1' serves as an output signal line C of the NAND gate. The source S of N channel MOS transistor N1 and drain D of N channel MOS transistor N2 are commonly connected to local line LL5 through contact holes CH.

P channel MOS transistor P1 and N channel MOS transistor N1 have their gates commonly connected to local line LL1 through pads PD and contact holes CH, local line LL1 is connected to contact electrode EL via a through hole TH, and contact electrode EL is connected to signal line SL5, for example, via a through hole TH. Therefore, signal line SL5 serves as one input signal line A of the NAND gate.

P channel MOS transistor P2 and N channel MOS transistor N2 have their gates G commonly connected to local line LL7 through pads PD and contact holes CH, local line LL7 is connected to contact electrode EL via a through hole TH, and contact electrode EL is connected to signal line SL2', for example, via a through hole TH. Therefore, signal line SL2' serves as the other input signal line B of the NAND gate.

Figure 27:
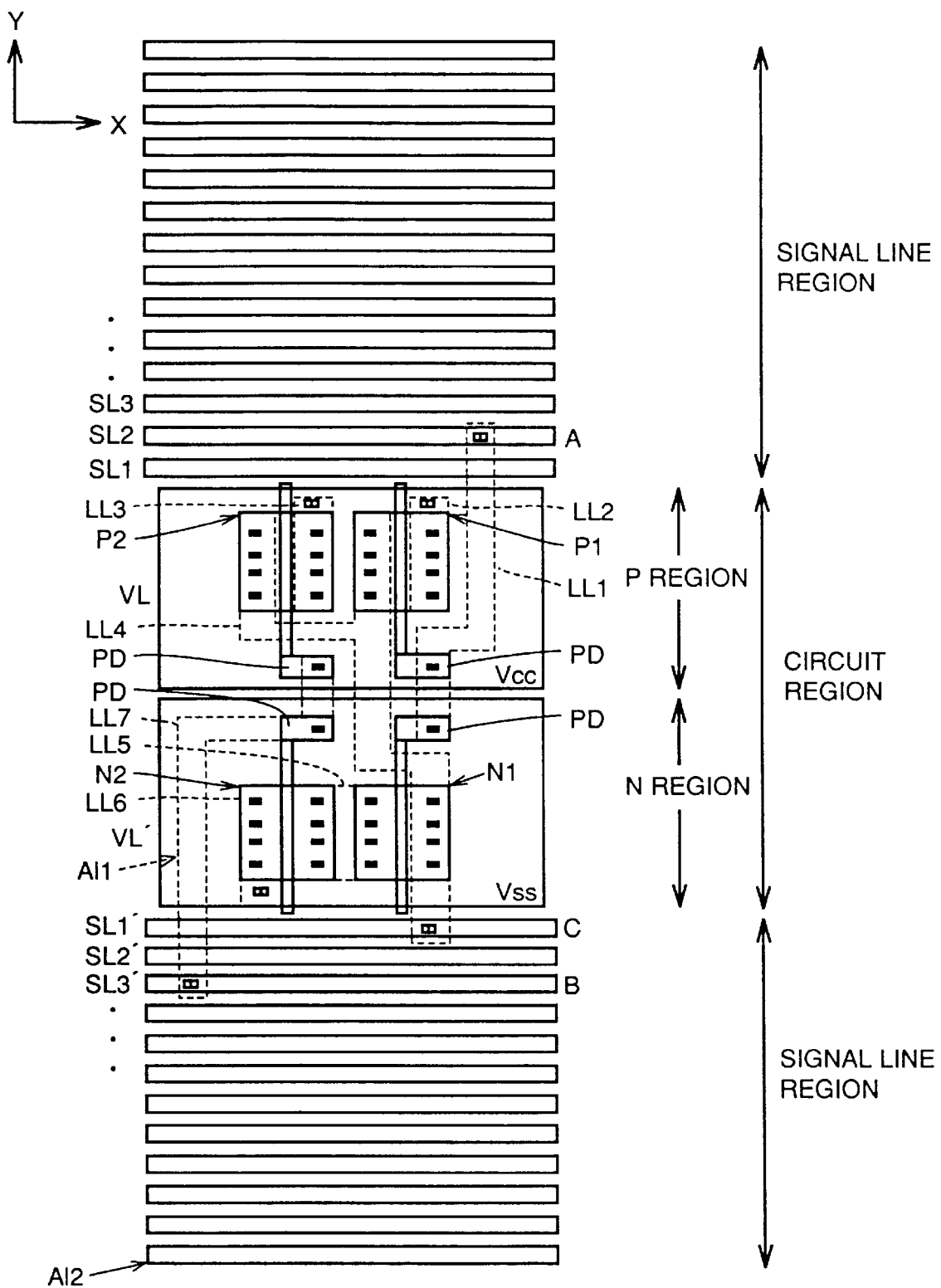
FIG. 27 is a partially fragmented plan view showing layout of an area including a NAND gate of the peripheral circuit region of the DRAM chip shown in FIG. 25.
Figure 28:
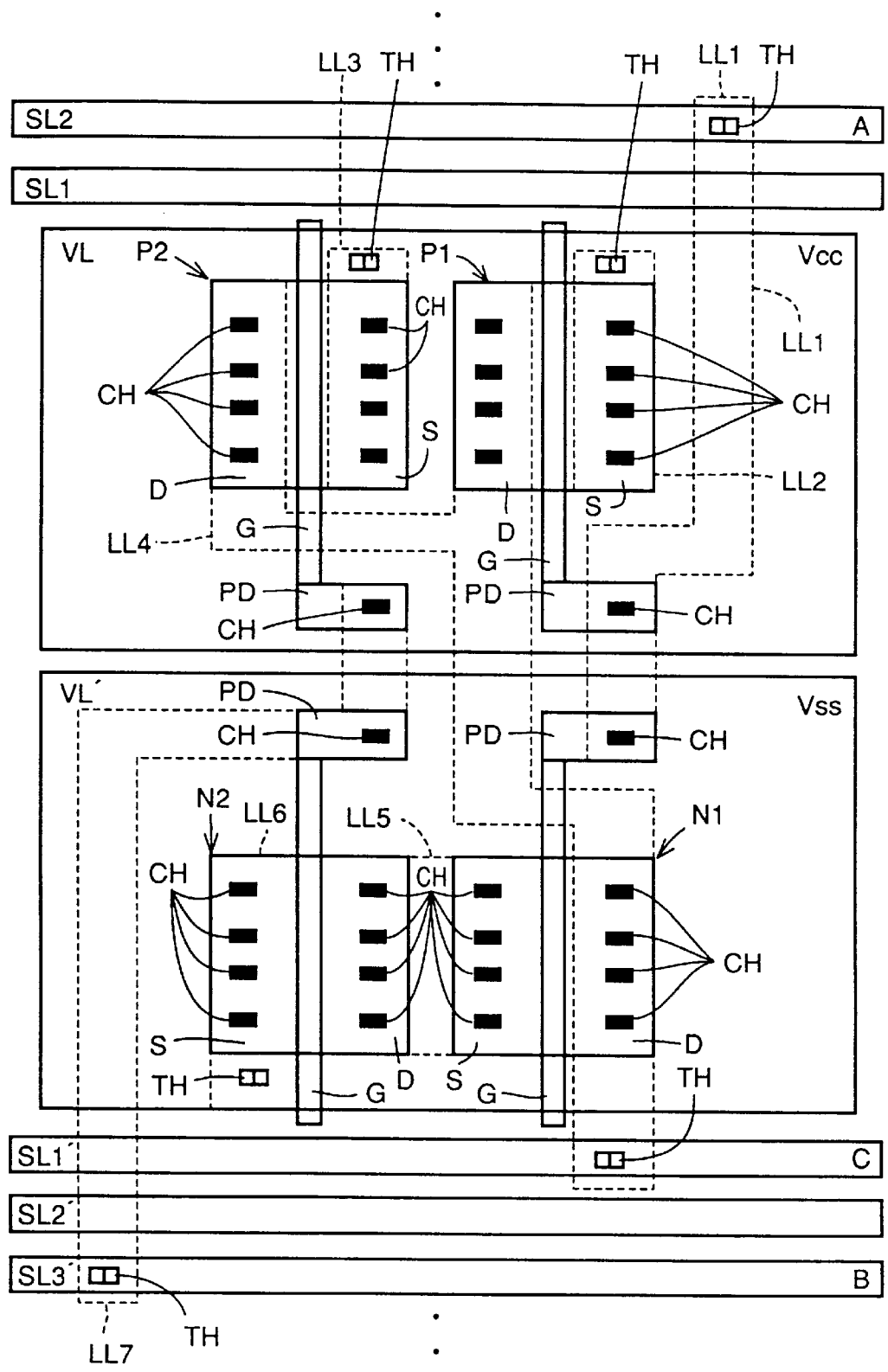
FIG. 28 is an enlarged view of a main portion of the area including the NAND gate shown in FIG. 27.
Figure 29:
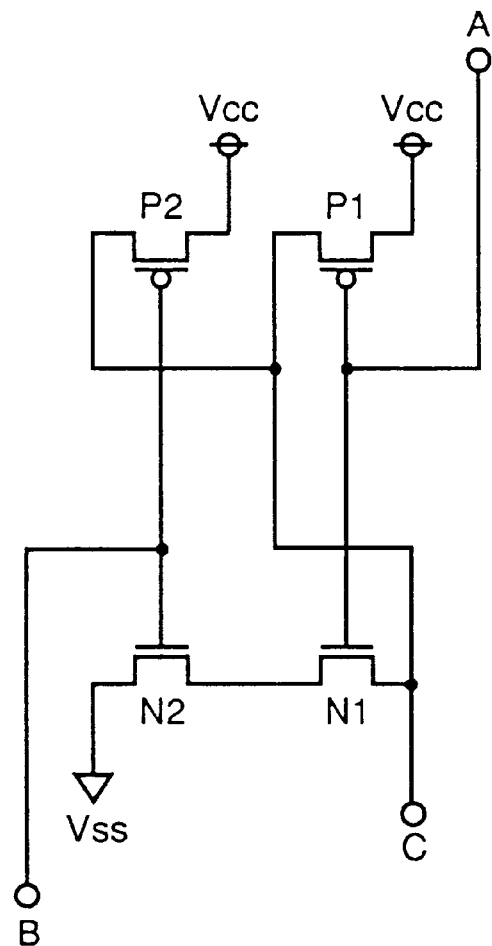
FIG. 29 is a schematic diagram showing the structure of the NAND gate.
Figure 30:
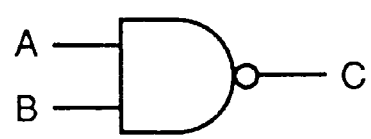
FIG. 30 shows a sign representing a NAND gate.

In this embodiment, signal lines SL and SL' formed of aluminum interconnection Al2 of the third layer can also be arranged over the circuit region, and therefore, the layout area can be significantly reduced as compared with the conventional layout shown in FIG. 27. Further, the distance of crossunder connecting terminals of transistors P1, P2, N1 and N2 with signal lines SL and SL' can be shortened.

Further, since the sources of transistors P1, P2 and N1 can be directly connected to aluminum interconnection layer Al1 of the second layer, source resistance can be reduced. Further, since power supply lines VL and VL' formed of aluminum interconnection pattern Al1 are provided between signal lines SL and SL' and local line LL, coupling noise between signal lines SL and SL', local lines LL, and signal lines SL and SL' and local lines LL can be reduced by the shield effect, thus widening the operation margin.

Though interconnection capacitance is increased in the first embodiment because of power supply lines VL and VL' formed of aluminum interconnection pattern Al2 as the third layer provided on signal lines SL and SL', interconnection capacitance does not increase in this embodiment, and therefore it is advantageous in view of signal transmission speed.

Figure 8:
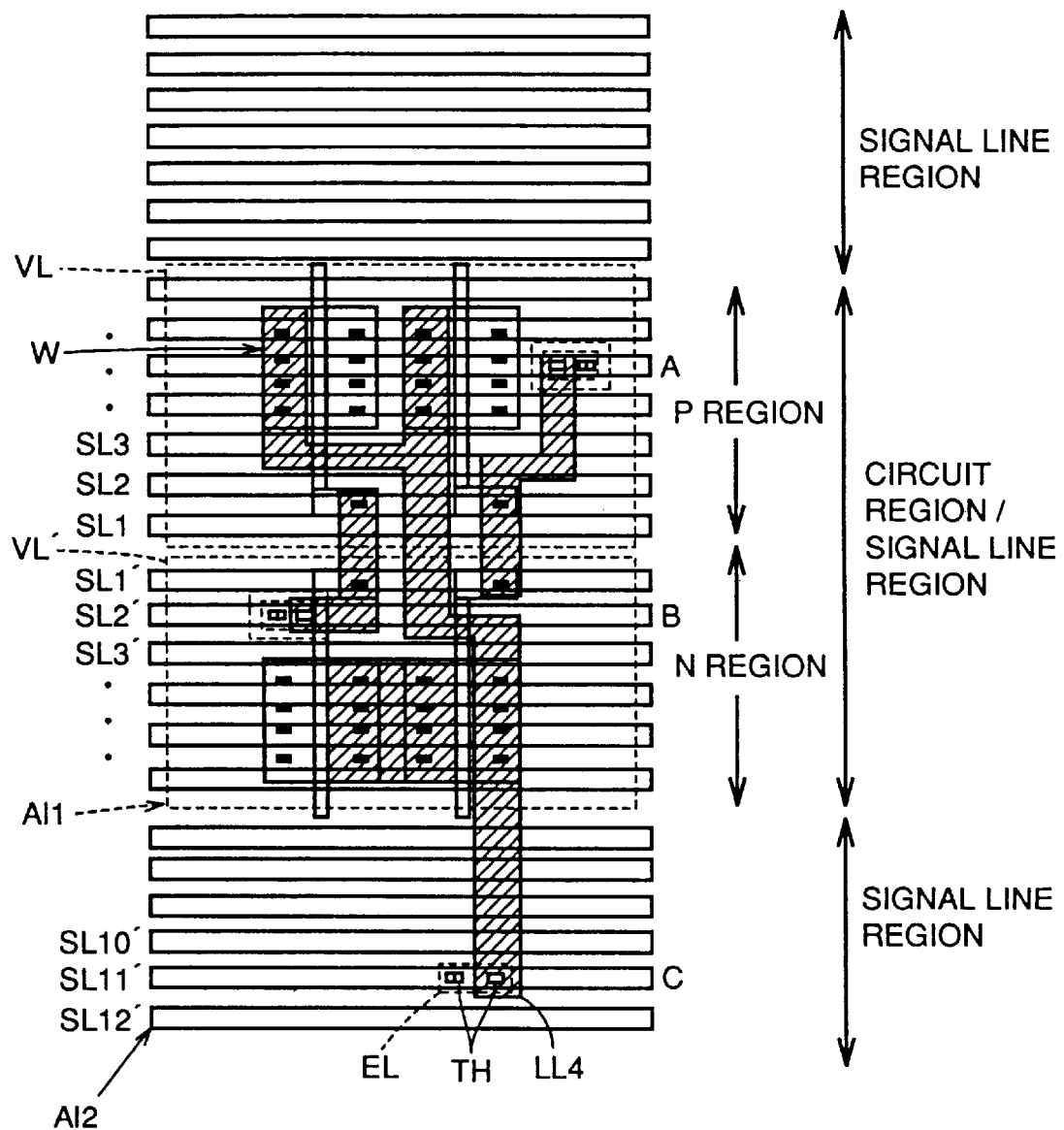
FIG. 8 is a partially fragmented plan view showing an example of improvement of the second embodiment.

Meanwhile, one end of local line LL4 shown in FIGS. 5 to 7 may be extended to the signal line region, and the end may be connected to signal line SL11' via a through hole TH and a contact electrode EL, as shown in FIG. 8. As described above, in this embodiment, arrangement of transistors P1, P2, N1 and N2 and arrangement of signal input/output lines A, B and C are not limited at all, and these can be laid-out freely.

Figure 9:
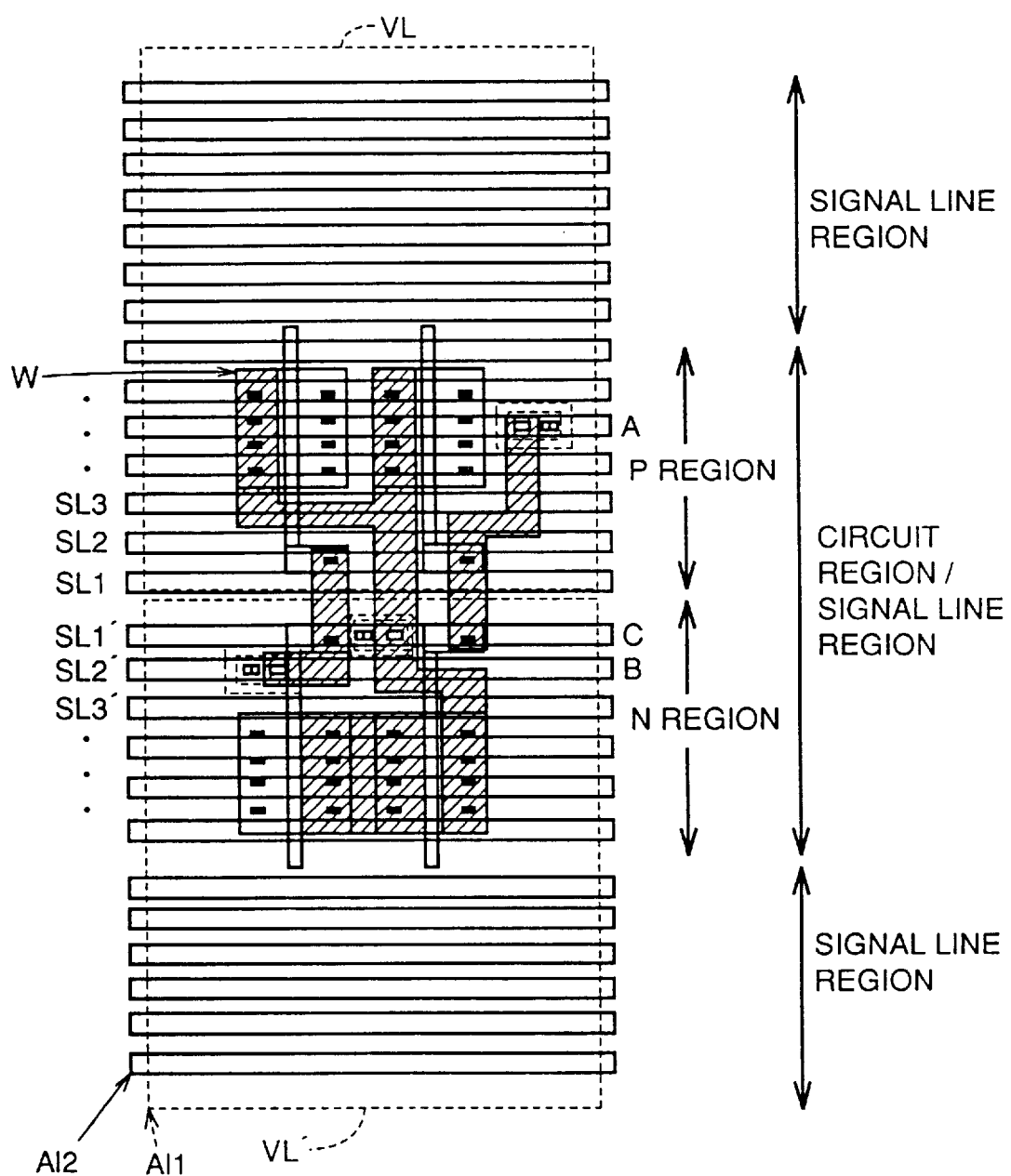
FIG. 9 is a partially fragmented plan view showing another example of improvement of the second embodiment.
Figure 10:
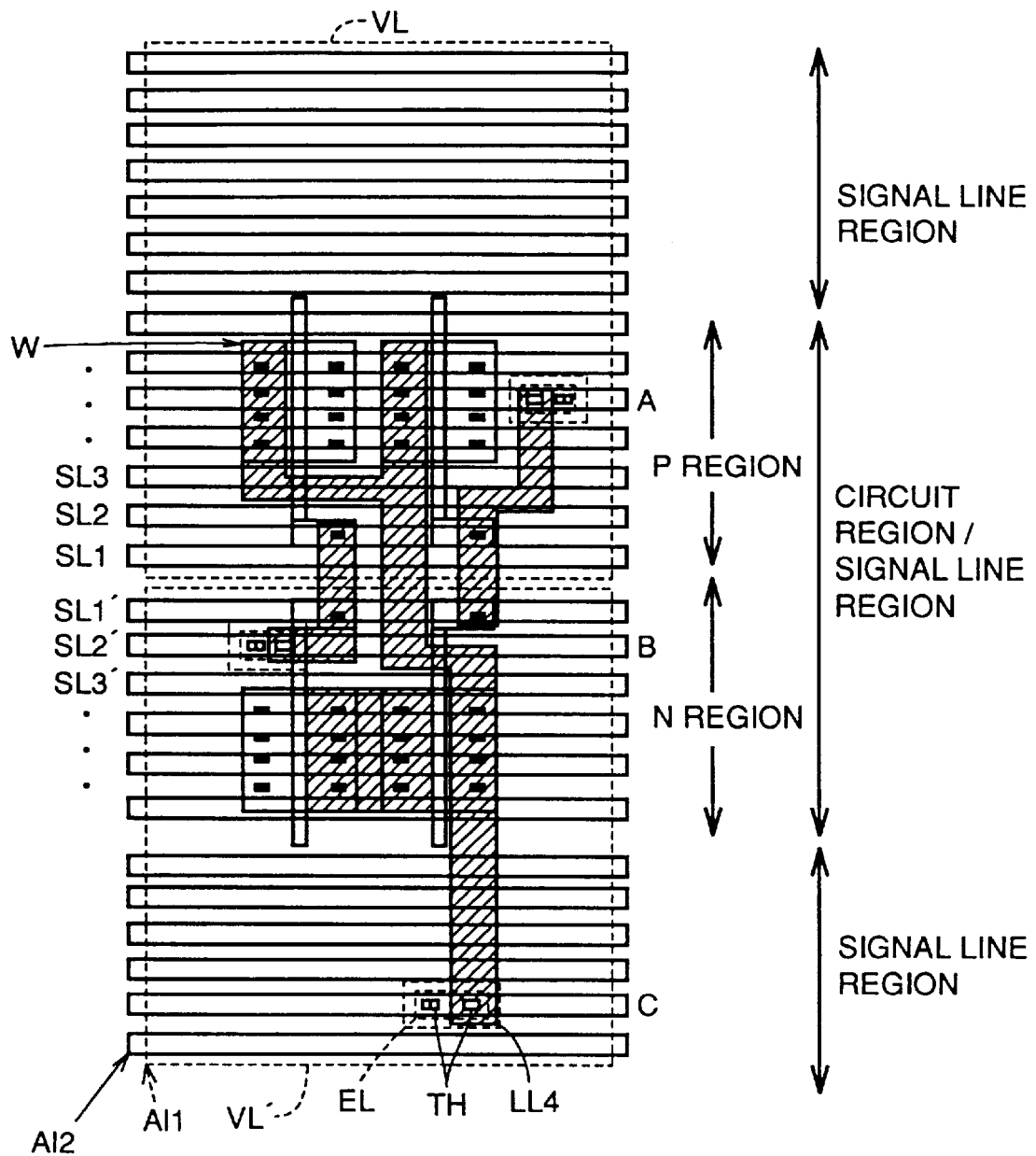
FIG. 10 is a partially fragmented plan view showing a still further example of improvement of the second embodiment.

In FIGS. 5 and 8, the width of power supply lines VL and VL' formed of the second layer, that is, aluminum interconnection pattern Al1 is shown as approximately the same as that of the circuit region. However, the width of power supply lines VL and VL' may be widened to the signal line region, as shown in FIGS. 9 and 10. In that case, electric resistance of power supply lines VL and VL' is reduced.

[Embodiment 3]

Figure 11:
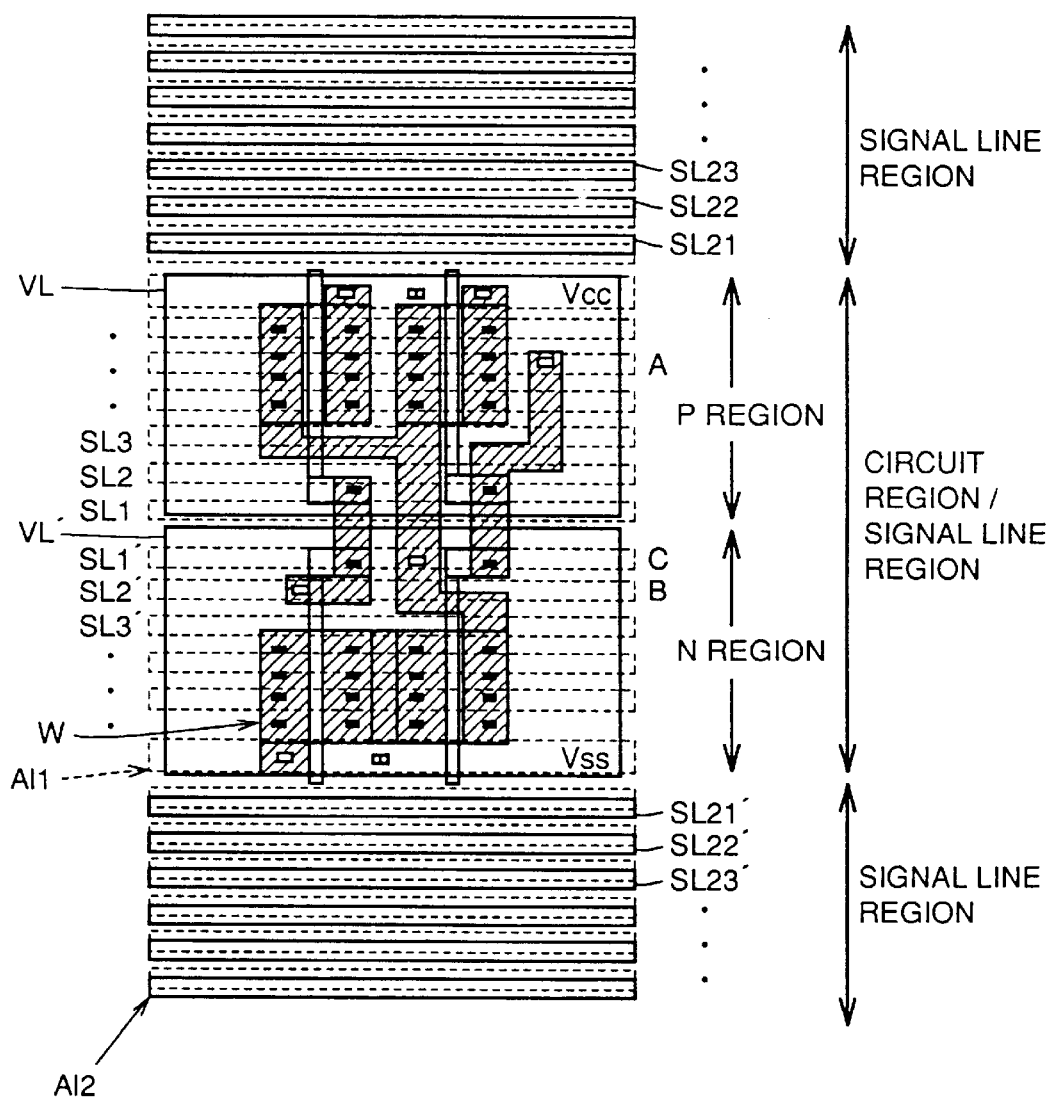
FIG. 11 is a partially fragmented plan view showing layout of the area including a NAND gate in a peripheral circuit region of a DRAM chip in accordance with a third embodiment of the present invention.

FIG. 11 is a partially fragmented plan view showing the layout of an area including the NAND gate in peripheral circuit region 32 of the DRAM chip in accordance with the third embodiment of the present invention. The layout is an improvement over that of FIG. 1. In FIG. 1, the signal line region is formed of the second layer only, that is, by the aluminum interconnection pattern Al1. However, in the example of FIG. 11 the signal line region is formed of both the second and third layers, that is, aluminum interconnection patterns Al1 and Al2.

More specifically, the third layer of aluminum interconnection pattern Al2 is used not only as power supply lines VL and VL' but also as signal lines SL21, SL22, . . . ; SL21', SL22', . . . Signal lines SL21, SL22, . . . are arranged at a prescribed pitch outward from the power supply line VL, while signal lines SL21', SL22', . . . are arranged at a prescribed pitch outward from power supply line VL'. As can be seen from the figure, in the signal line region, the signal lines SL1, SL2, . . . ; SL1', SL2', . . . formed of the second layer of aluminum interconnection pattern Al1 and signal lines SL21, S122, . . . ; SL21', SL22', . . . formed of the third layer of aluminum interconnection pattern Al2 are arranged shifted from each other by half the arrangement pitch.

In this embodiment, both the second and third layers of aluminum interconnection patterns Al1 and Al2 are used as signal lines SL and SL'. Therefore, the width of the signal line region can be reduced to approximately one half that of the embodiment of FIG. 1, thus further reducing the layout area.

Further, the signal lines SL1, SL2, . . . ; SL1', SL2', . . . of the second layer and signal lines SL21, SL22, . . . ; SL21', SL22', . . . of the third layer are provided shifted by one half the arrangement pitch. Therefore, the area of overlap between the signal lines is reduced, and hence noise between interconnections and time constant of interconnections can be suppressed.

The structure can also be applied to the embodiment of FIG. 5. More specifically, when the second layer of aluminum interconnection pattern Al is used not only as power supply lines VL and VL' but also as signal lines SL and SL', the area of the signal line region can be similarly reduced.

[Embodiment 4]

Figure 12:
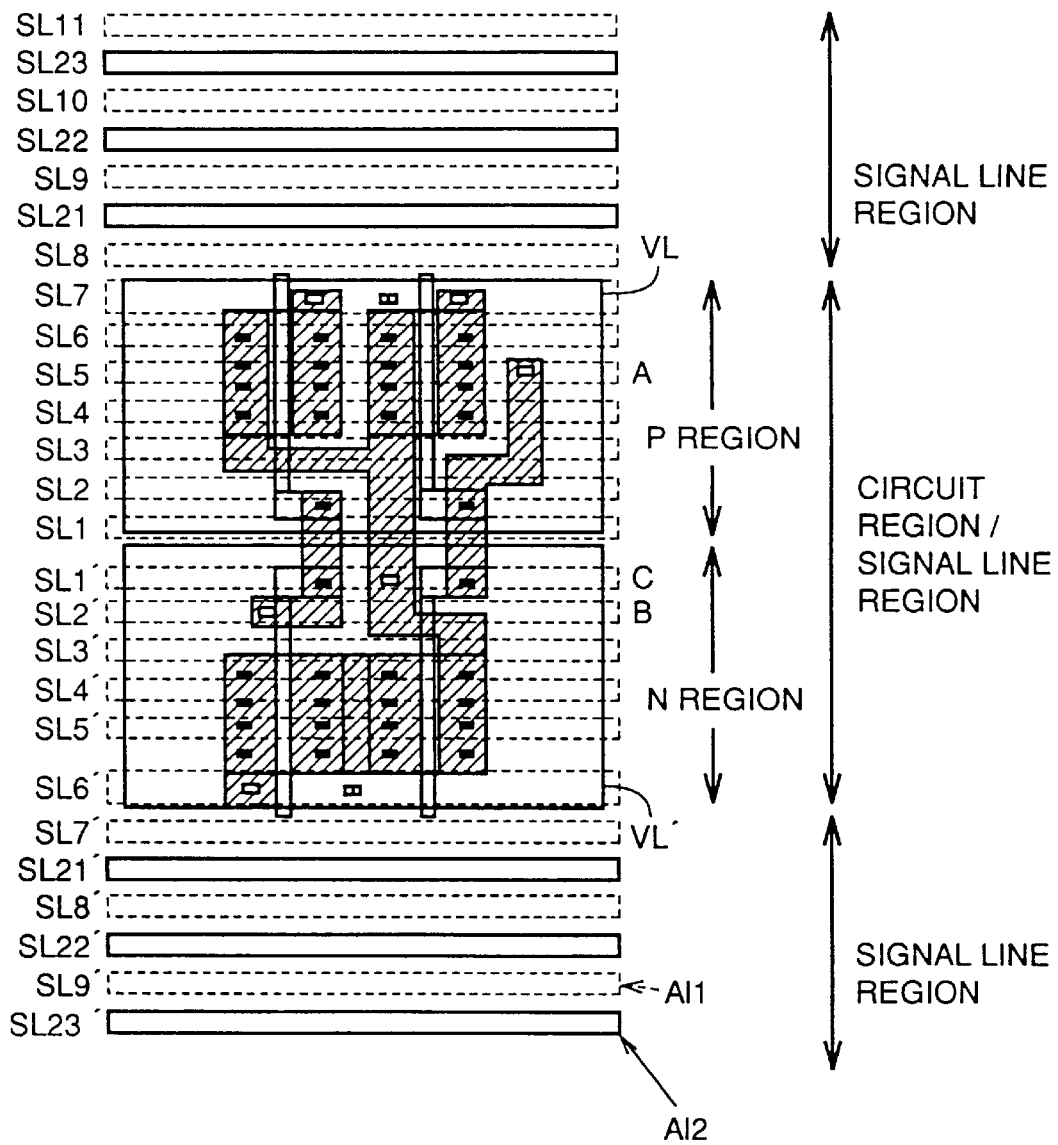
FIG. 12 is a partially fragmented plan view showing layout of the area including a NAND gate in a peripheral circuit region of a DRAM chip in accordance with a fourth embodiment of the present invention.

FIG. 12 is a partially fragmented plan view showing a layout of an area including an NAND gate of the peripheral circuit region 32 of the DRAM chip in accordance with the fourth embodiment of the present invention. This layout is an improvement over the layout of FIG. 1. The signal line region which was formed only by the second layer, that is, aluminum interconnection pattern Al1 in FIG. 1 is formed by using both the second and third layers, that is, aluminum interconnection patterns Al1 and Al2, and in the signal line region, the second layer of aluminum interconnection pattern Al1 and the third layer of aluminum interconnection pattern Al2 are provided not to be overlapped with each other.

More specifically, in the signal line region, the second layer of signal lines SL8, SL9, . . . ; SL7', SL8', . . . are arranged at double the pitch of the embodiment shown in FIG. 1. The third layer of signal lines SL21, SL22, . . . ; SL21', SL22', . . . are arranged at the same pitch as but shifted by 1/2 pitch from the second layer signal lines SL8, SL9, . . . ; SL7', SL8', . . . Therefore, the second layer of signal lines SL8, SL9, . . . ; SL7', SL8', . . . and third layer of signal lines SL21, SL22, . . . ; SL21', SL22', . . . are arranged alternately, not overlapping with each other when viewed from above.

In this embodiment, the pitch of signal lines SL and SL' is set to be twice that of the embodiment of FIG. 1. Therefore, capacitance between lines can be reduced to one half, the noise between interconnections and time constant of interconnections can be reduced. Further, since the second layer of aluminum interconnection pattern Al1 and the third layer of aluminum interconnection pattern Al2 are both used as signal lines SL and SL', the layout area is not increased.

This structure can also be applied to the embodiment of FIG. 5. More specifically, when the second layer, that is, aluminum interconnection pattern Al1 is used not only as power supply lines VL and VL' but also as signal lines SL21, SL22, . . . ; SL21', SL22', . . . , and the second layer of signal lines SL21, SL22, . . . ; SL21', SL22', . . . and the third layer of signal lines SL1, SL2, . . . ; SL1', SL2', . . . are arranged not overlapped with each other in the vertical direction in signal line region, then, capacitance between lines can be reduced similarly.

[Embodiment 5]

In Embodiments 1 to 4, the first layer, that is, interconnection pattern W of metal having high melting point serving as the layer for bit lines BL and /BL has such a structure that allows connection to both the $N^+$ and $P^+$ diffusion regions. However, generally, the memory cell MC is formed by N channel MOS transistor. Therefore, it is possible to connect the interconnection pattern W of metal having high melting point to the $N^+$ diffusion region, but connection to $P^+$ diffusion region is not always possible. Therefore, an embodiment will be described in which the interconnection layer W of metal having high melting point can be connected only to the $N^+$ diffusion region.

Figure 13:
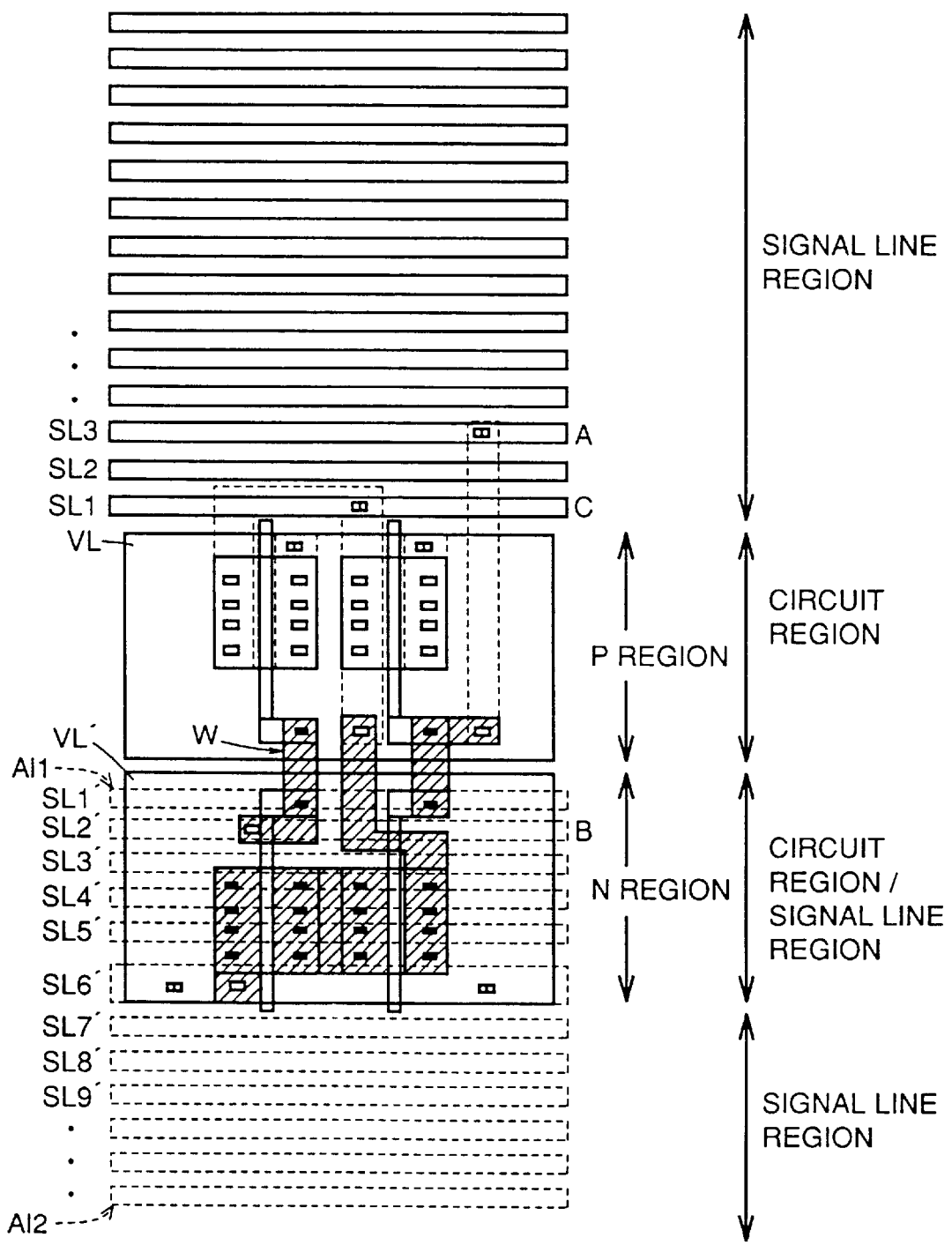
FIG. 13 is a partially fragmented plan view showing layout of the area including a NAND gate in a peripheral circuit region of a DRAM chip in accordance with a fifth embodiment of the present invention.
Figure 14:
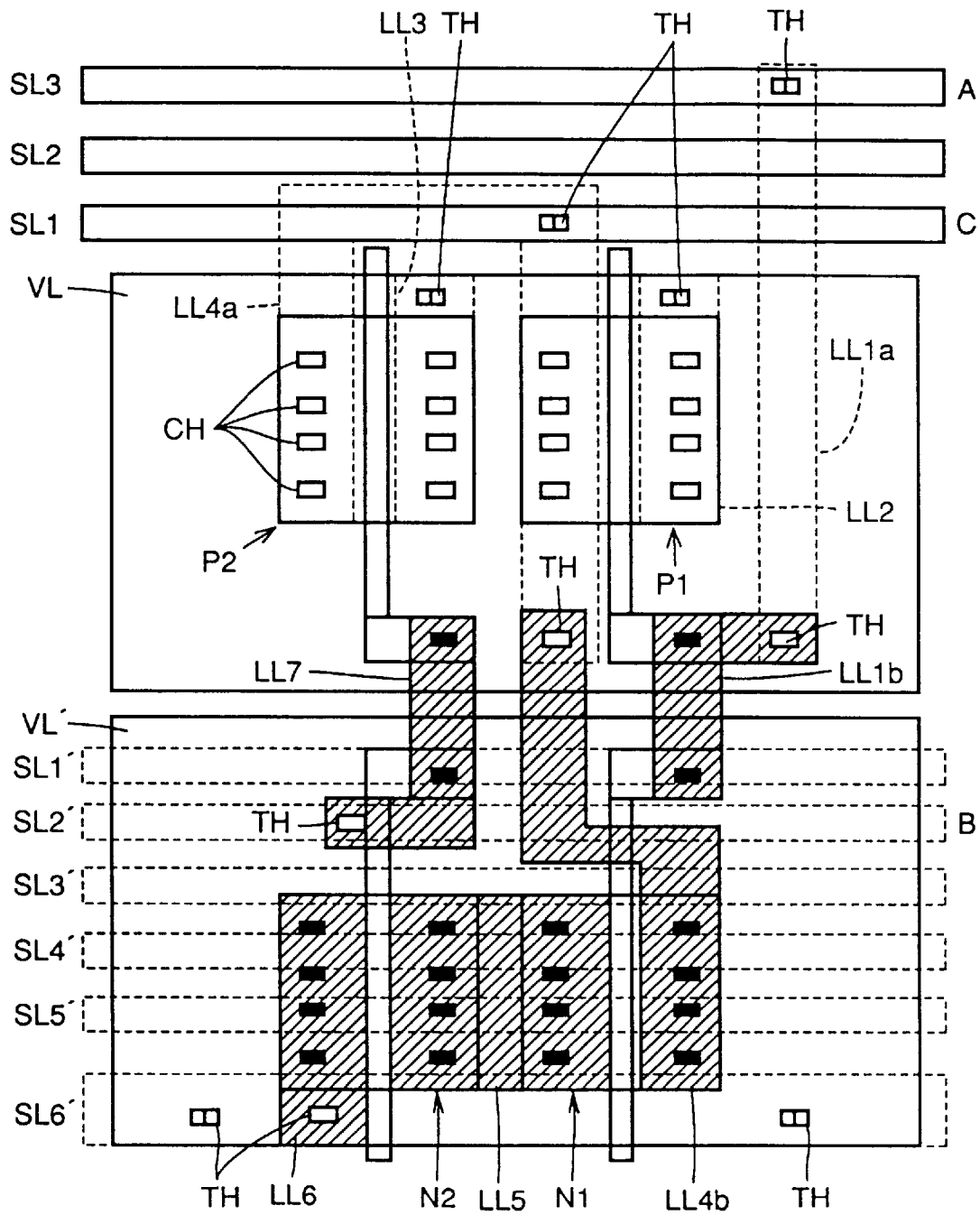
FIG. 14 is an enlarged view of a main portion of the area including the NAND gate shown in FIG. 13.

FIG. 13 is a partially fragmented plan view showing layout of the area including the NAND gate in peripheral circuit region 32 of the DRAM chip in accordance with the fifth embodiment of the present invention, and FIG. 14 is an enlarged view of the main portion thereof. The N region in which N channel MOS transistors N1 and N2 are provided and the signal line region adjacent to the N region have the same layout as the embodiment shown in FIG. 1. Namely, local line LL is formed by the first layer, that is, interconnection pattern W of metal having high melting point, signal lines SL1' to SL6' are formed by the second layer, that is, aluminum interconnection pattern Al1, and the power supply line VL' is formed by the third layer, that is, aluminum interconnection pattern Al2. Meanwhile, the P region in which P channel MOS transistors P1 and P2 are provided and signal line region adjacent to the P region have the same layout as the prior art example shown in FIG. 27.

More specifically, the source of N channel MOS transistor N1 and the drain D of N channel MOS transistor N2 are commonly connected to local line LL5 through contact holes CH. The source S of N channel MOS transistor N2 is connected to power supply line VL' through contact hole CH, local line LL6, through hole TH, signal line SL6' and through hole TH. The gate D of N channel MOS transistor N2 and the gate G of P channel MOS transistor P2 are connected to signal line SL2' through pads PD, contact holes CH, local line LL7 and through hole TH. The drain D of N channel MOS transistor N1 is connected to local line LL4$b$ through a contact hole CH, and one end of local line LL4$b$ extends to the P region.

The end portion of local line LL4$b$ is connected to local line LL4$a$ through a through hole TH, and local line LL4$a$ is connected to the drains D of P channel MOS transistors P1 and P2 through contact holes CH. Further, local line LL4$a$ is connected to signal line SL1 via a through hole TH. P channel MOS transistors P1 and P2 have their sources S connected to power supply line VL through contact holes CH, local lines LL2 and LL3 and through hole TH. N channel MOS transistor N1 and P channel MOS transistor P1 have their gates G connected to local line LL1$b$, one end of local line LL1$b$ is connected to one end of local line LL1$a$ via through hole TH, and the other end of local line LL1$a$ is connected to signal line SL3 via a through hole TH.

In this embodiment, since signal lines SL1' to SL6' are provided also on the N region, the layout area can be significantly reduced as compared with the prior art example shown in FIG. 27. However, the effect of reduction in layout area is about one half that of the embodiment shown in FIG. 1.

In this structure, when the width of power supply line VL' is widened to the signal line region as in the embodiment of FIG. 9, the impedance of the power supply line VL' can be reduced.

Further, the signal line SL' in the signal line region on the N region side may be formed by both the second and third layers of aluminum interconnection patterns Al1 and Al2, as shown in FIGS. 11 and 12.

Further, if the memory cell MC is formed by a P channel MOS transistor and the first layer of interconnection pattern W of metal having high melting point can be connected only to the P$^+$ diffusion region, the same structure can be applied, with the N and P regions reversed.

[Embodiment 6]

Figure 15:
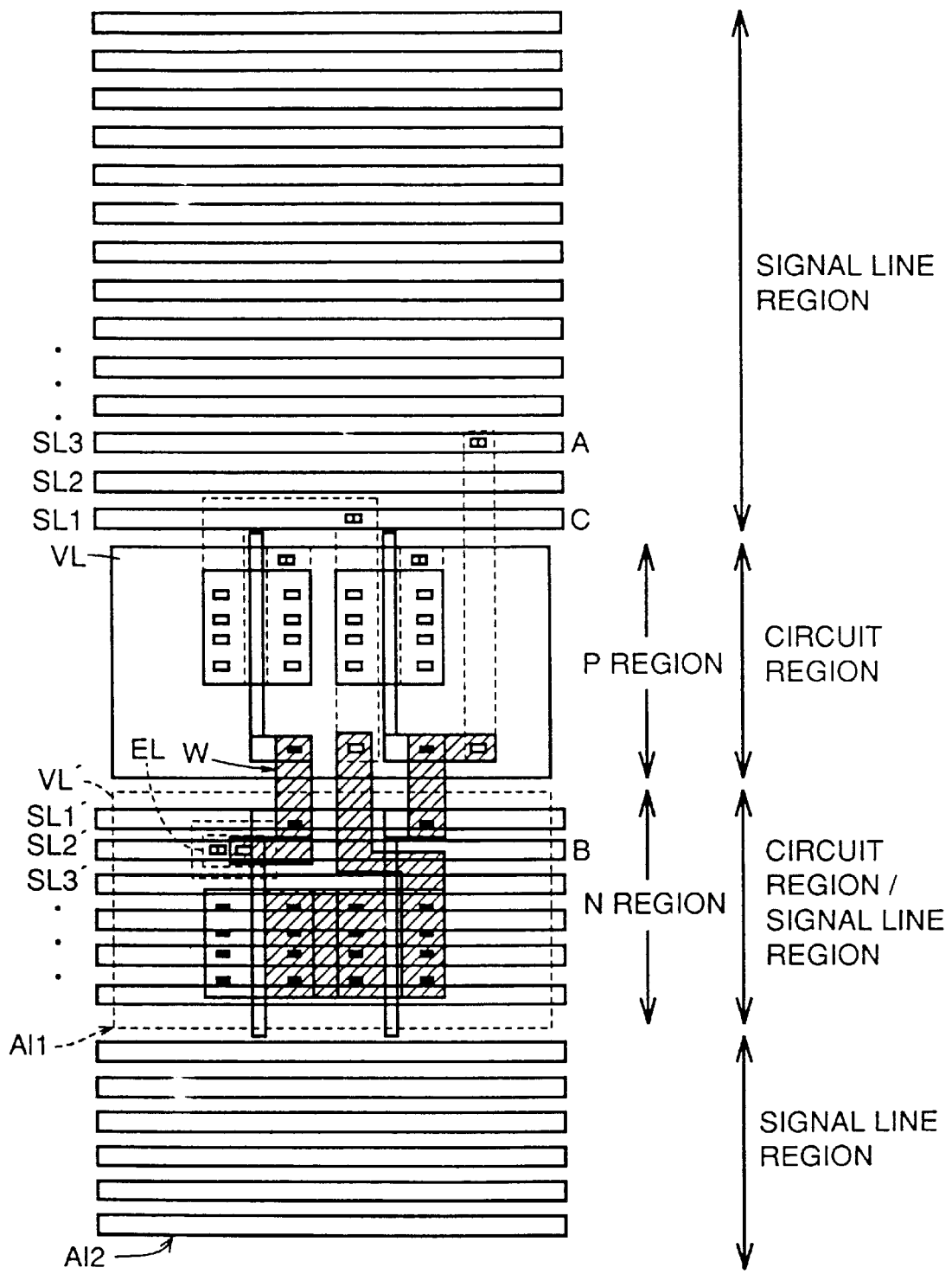
FIG. 15 is a partially fragmented plan view showing layout of an area including a NAND gate in a peripheral circuit region of a DRAM chip in accordance with a sixth embodiment of the present invention.
Figure 16:
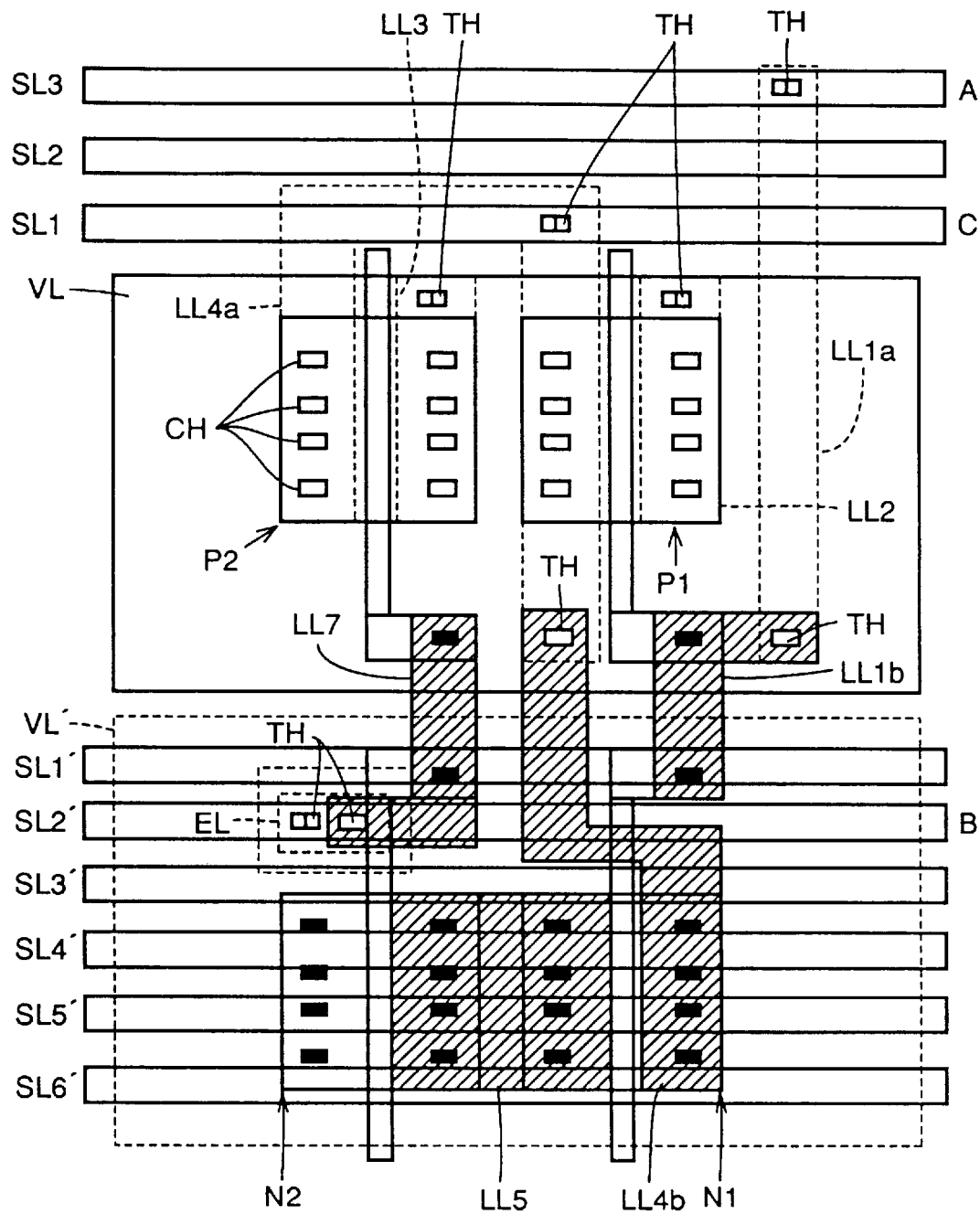
FIG. 16 is an enlarged view of a main portion of the area including the NAND gate shown in FIG. 15.

FIG. 15 is a partially fragmented plan view showing a layout of the area including the NAND gate of peripheral circuit region 32 of the DRAM chip in accordance with the sixth embodiment of the present invention, and FIG. 16 is an enlarged view of the main portion thereof. This layout is applied when the first layer of interconnection pattern W of metal having high melting point cannot be connected to the P$^+$ diffusion region, in the embodiment of FIG. 5. In the N region, local line LL is formed by the first layer of interconnection pattern W of metal having high melting point, the power supply line VL' is formed by the second layer of aluminum interconnection pattern Al1, and the third signal lines SL1', SL2', . . . are formed by the third layer of aluminum interconnection pattern Al2, as in the embodiment of FIG. 5. Meanwhile, the P region has the same layout as the prior art example shown in FIG. 27. The connection is the same as that of the embodiment shown in FIG. 13 except that the source S of N channel MOS transistor N2 is directly connected to power supply line VL' through a contact hole CH, and that local line LL7 is connected to signal line SL2' via a through hole TH, contact electrode EL and a through hole TH.

In this embodiment, since signal lines SL1' to SL6' are arranged also in the N region, the layout area can be significantly reduced as compared with the prior art example of FIG. 27. However, the effect of reducing the layout area is about one half that of the embodiment of FIG. 1.

Meanwhile, when the width of the power supply line VL' is widened to the signal line region adjacent to the N region as in the embodiment of FIG. 10, the impedance of power supply line VL' can be reduced. Further, in this structure, in the signal line region adjacent to the N region, the signal lines SL and SL' may be formed both by the second layer and third layer of aluminum interconnection patterns Al1 and Al2 as in the embodiment shown in FIGS. 11 and 12.

Further, when the memory cell MC is constituted by a P channel MOS transistor and the interconnection pattern W of metal having high melting point of the first layer can be connected only to the P$^+$ diffusion region, similar structure can be used, with the structure of N and P regions reversed.

[Embodiment 7]

The second layer, that is, aluminum interconnection pattern Al1 is made thinner than the third layer, that is, aluminum interconnection pattern Al2 for planarization. Therefore, it has larger resistance value than the third layer of aluminum interconnection pattern Al2. Further, since there are interconnection patterns Al2 and W above and below the second layer of aluminum interconnection pattern Al1, the second layer has smaller capacitance than the third layer of aluminum interconnection pattern Al2. Therefore, when long lines are formed by the third layer of aluminum interconnection pattern Al2 and short lines are formed by the second layer of aluminum interconnection pattern Al1, efficient layout can be realized.

Figure 18:
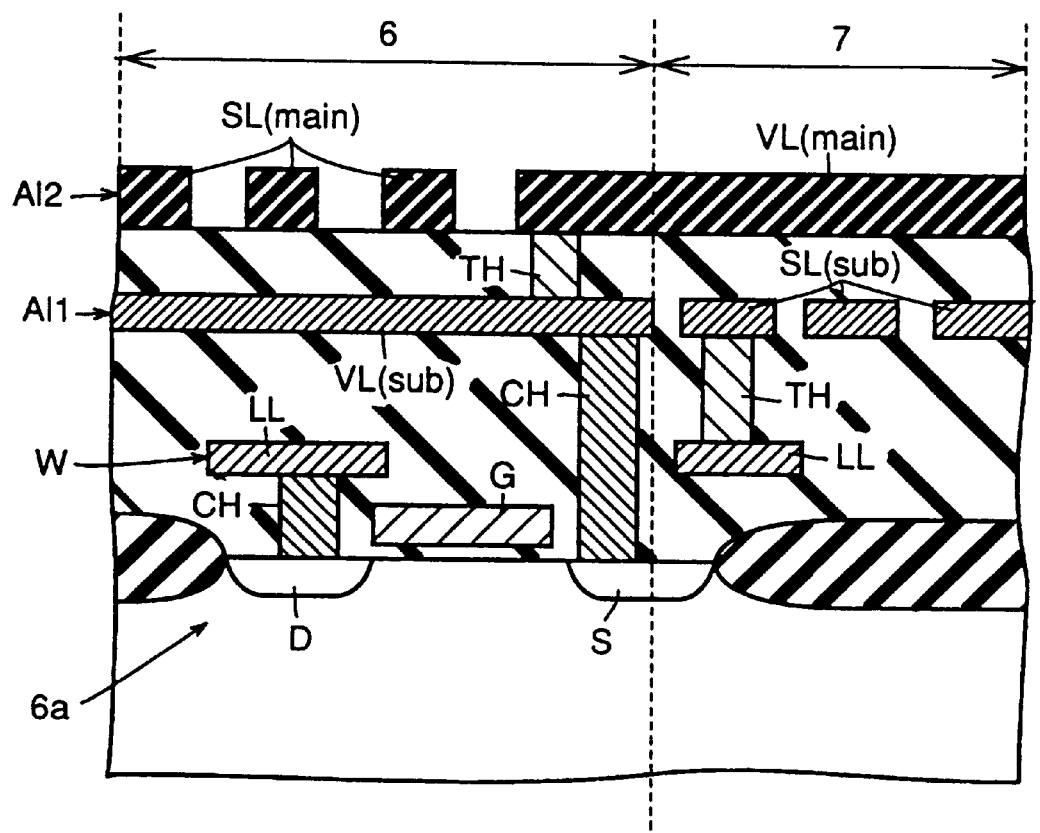
FIG. 18 is a cross sectional view of the main portion of the DRAM chip shown in FIGS. 17A and 17B.

FIG. 17A is a block diagram showing the structure of the DRAM chip in accordance with the seventh embodiment of the present invention, FIG. 17B is an enlarged view of the main portion thereof, and FIG. 18 is a cross section of the main portion. Referring to these figures, the DRAM chip includes a plurality of memory array regions 1 and a peripheral circuit region 5 provided between the memory array regions. Each memory array region 1 includes a plurality of sub arrays 2, and a row decoder 3 and a column decoder 4 provided for each sub array 2. Specific structure of the memory array region 1 is the same as the conventional DRAM chip shown in FIGS. 25 and 26, and therefore description thereof is not repeated.

Peripheral circuit region 5 includes a main control signal generating circuit 6 for generating a main control signal based on which the DRAM chip operates, a sub control signal generating circuit 7 for generating a sub control signal in response to the main control signal for driving a corresponding sub array 2, and a plurality of external power supply pads 8 to which power supply potentials Vcc and Vss are applied externally.

The third layer, that is, aluminum interconnection pattern Al2 used as the column selection line CSL in memory array region 1 is used, in the peripheral circuit region 5, as the main power supply line VL (main), VL (main)' and a main signal line SL (main). The main power supply lines VL (main) and VL (main)' are provided to cover sub signal generating circuit 7. The main signal lines SL (main) are formed as a number of strips and formed to cover main control signal generating circuit 6.

The power supply potentials Vcc and Vss applied to an external power supply pad 8 is distributed to the overall peripheral circuit region 5 through main power supply lines VL (main) and VL (main)'. The main control signals A (main), B (main) and C (main) generated in main control signal generating circuit 6 are transmitted to sub control signal generating circuit 7 through a main signal line SL (main).

These lines VL (main), VL (main)' and SL (main) are long. However, since these are formed by the third layer of aluminum interconnection pattern Al2 having low resistance and low capacitance, power consumption and signal delay over the lines VL (main), VL (main)' and SL (main) can be suppressed.

Further, the second layer, that is, aluminum interconnection pattern Al1 used as the shunt of word line WL in memory array region 1 is used as sub power supply lines VL (sub), VL (sub)' and sub signal lines SL (sub) in the peripheral circuit region 5. Sub power supply lines VL (sub) and VL (sub)' are provided to cover main control signal generating circuit 6, and connected to main power supply lines VL (main) and VL (main)'. Sub signal lines SL (sub) are formed as a number of strips and provided to cover the sub control signal generating circuit 7.

The power supply potentials Vcc and Vss applied to the external power supply pad and distributed to the overall peripheral circuit region 5 through main power supply lines VL (main) and VL (main)' are further applied to main control signal generating circuit 6 through sub power supply lines VL (sub) and VL (sub)'. Sub control signals A (sub), B (sub) and C (sub) generated in sub control signal generating circuit 7 are transmitted to the corresponding sub array 2 through the sub signal lines SL (sub).

Though these lines VL (sub), VL (sub)' and SL (sub) are formed by the second layer of aluminum interconnection pattern Al1 having high resistance and high capacitance, the power consumption and signal delay over the lines VL (sub), VL (sub)' and SL (sub) do not lead to any problem, since these lines are short.

The first layer of interconnection pattern W of metal having high melting point used as bit lines BL and /BL in the memory array region 1 are used as the local line LL for internal connection in main control signal generating circuit 6 and sub control signal generating circuit 7, as in the first to sixth embodiments above.

Figure 19:
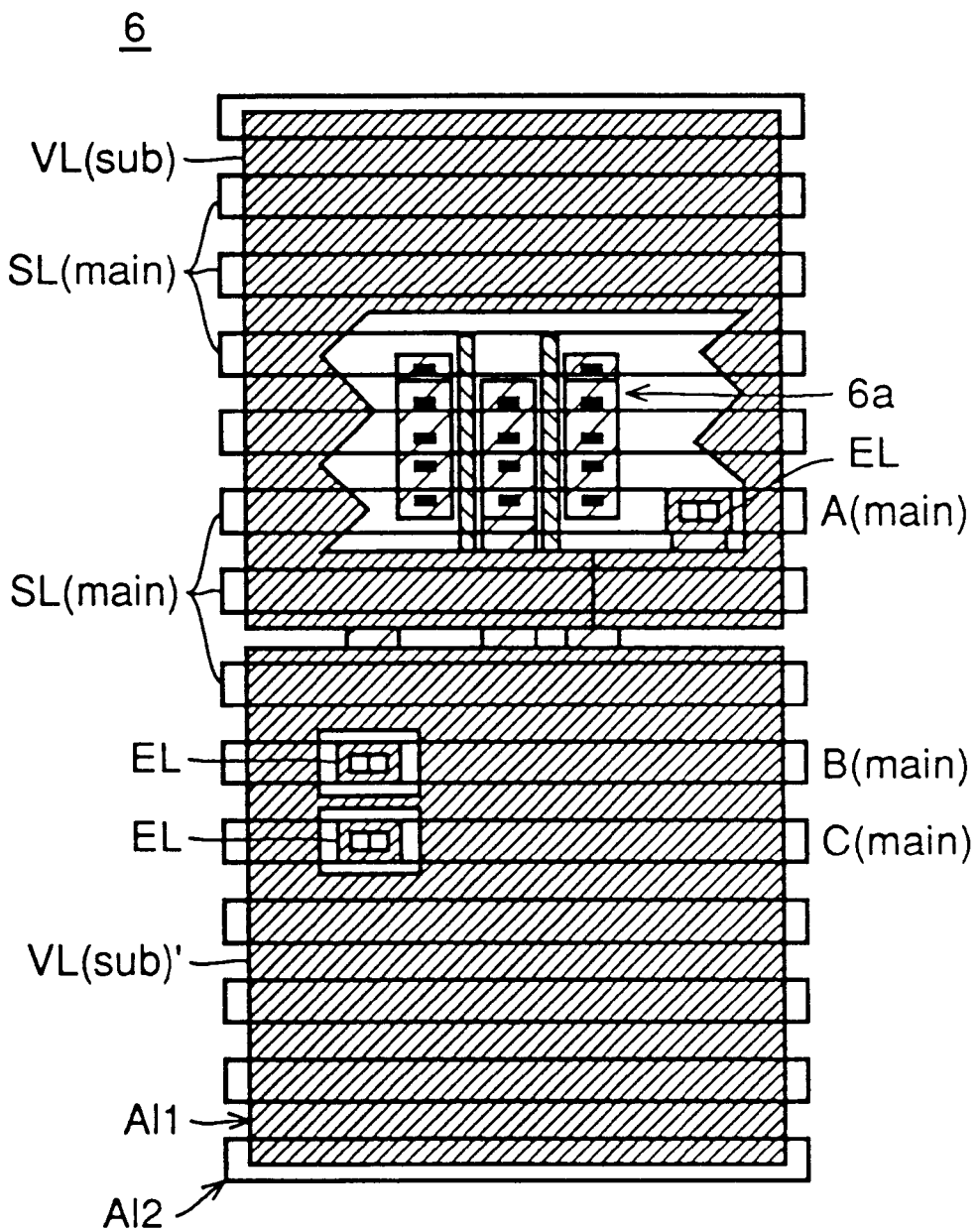
FIG. 19 is a partially fragmented plan view showing layout of a main control signal generating circuit in the peripheral circuit region of the DRAM chip shown in FIGS. 17A and 17B.

More specifically, referring to FIGS. 18 and 19, in main control signal generating circuit 6, main power supply lines VL (main) and VL (main)' are connected to sub power supply lines VL (sub) and VL (sub)' via through holes TH at the boundary with the sub control signal generating circuit 7, and power supply potentials Vcc and Vss are applied from main power supply lines VL (main) and VL (main)' to sub power supply lines VL (sub) and VL (sub)'. Sub power supply lines VL (sub) and VL (sub)' are connected to transistor 6a and so on constituting the main control signal generating circuit 6 via contact holes CH, and thus power supply potentials Vcc and Vss are applied to transistor 6a and the like from sub power supply lines VL (sub) and VL (sub)'.

In main control signal generating circuit 6, portions of main power supply lines VL (main) and VL (main)' are insulated from the surroundings and serve as the contact electrode EL, as in the second embodiment. Main control signals A (main), B (main) and C (main) generated by transistor 6a and the like constituting main control signal generating circuit 6 are applied to main signal line SL (main) through contact electrode EL, and transmitted to entire peripheral circuit region 5 through main signal line SL (main).

Figure 20:
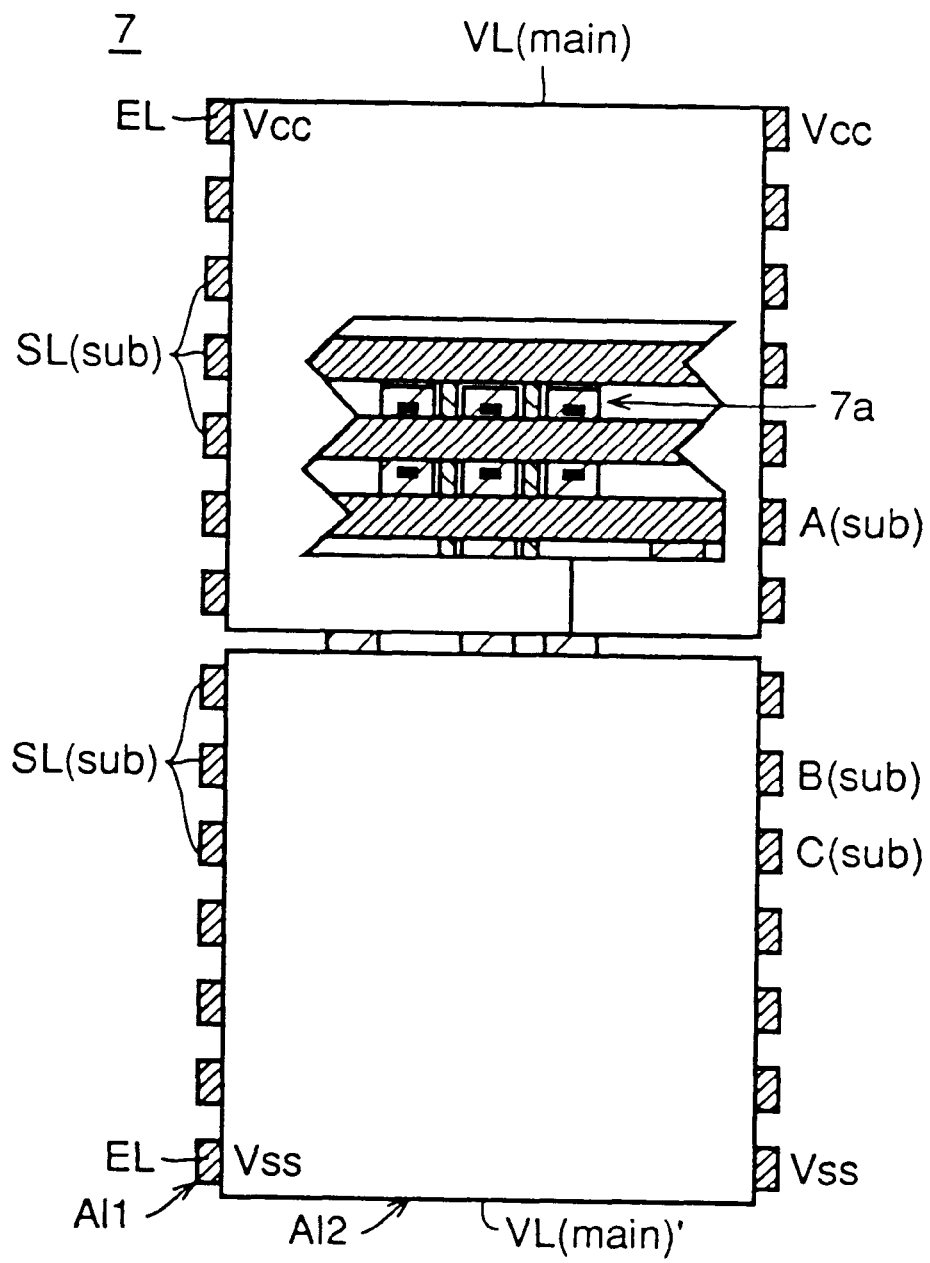
FIG. 20 is a partially fragmented plan view showing layout of a sub control signal generating circuit in the peripheral circuit region of the DRAM chip shown in FIGS. 17A and 17B.

In sub control signal generating circuit 7, any of the sub signal lines SL (sub) is used as the contact electrode EL in the similar manner as described in the first embodiment, as shown in FIG. 20. Main power supply lines VL (main) and VL (main)' are connected to contact electrode EL via through holes TH, and power supply potentials Vcc and Vss are applied to the contact electrode EL from main power supply lines VL (main) and VL (main)'. Contact electrode EL is connected to transistor 7a and the like constituting sub control signal generating circuit 7 through contact holes CH, and power supply potentials Vcc and Vss are applied to transistor 7a and the like from contact electrode EL.

Transistor 7a and the like constituting sub control signal generating circuit 7 generates sub control signals A (sub), B (sub) and C (sub) in response to main control signals A (main), B (main) and C (main). Sub control signals A (sub), B (sub) and C (sub) are applied to sub signal lines SL (sub), and transmitted to the corresponding sub array 2 through the sub signal lines SL (sub).

In this embodiment also, the first layer of interconnection pattern W of metal having high melting point is used as local line LL. Therefore, as compared with the prior art in which the second layer, that is, aluminum interconnection pattern Al1 is used as the local line LL, layout area can be significantly reduced.

Further, since long lines VL (main), VL (main)' and SL (main) are formed by the third layer of aluminum interconnection pattern Al2 having low resistance and low capacitance while short lines VL (sub), VL (sub)' and SL (sub) are formed by the second layer of aluminum interconnection pattern Al1 having high resistance and high capacitance, efficient layout can be realized.

[Embodiment 8]

Figure 21:
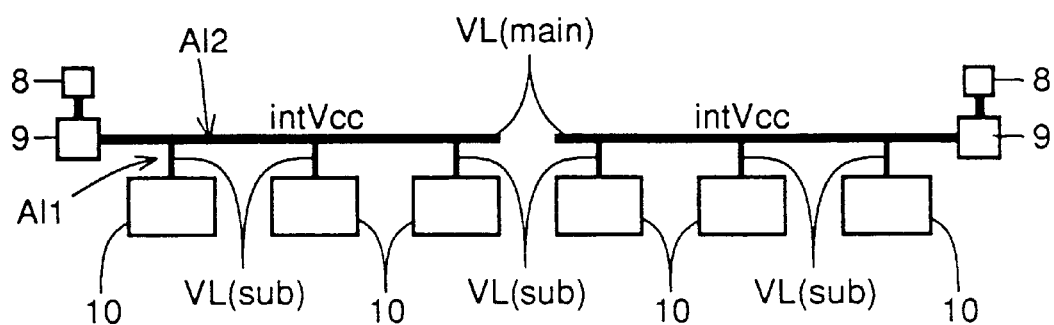
FIG. 21 is a block diagram showing a structure of a DRAM chip in accordance with an eighth embodiment of the present invention.

FIG. 21 is a partial block diagram showing the structure of the DRAM chip in accordance with the eighth embodiment of the present invention. Referring to the figure, the DRAM chip includes external power supply pads 8, voltage down converters (hereinafter simply referred to as VDC) 9 and a plurality of circuit blocks 10. An external power supply potential extVcc is applied to external power supply pad 8. VDC 9 lowers the external power supply potential extVcc and provides an internal power supply potential intVcc. Circuit blocks 10 are distributed to the entire area of the DRAM chip and perform prescribed operation upon reception of internal power supply potential intVcc.

In the DRAM chip, the third layer of aluminum interconnection pattern Al2 is used as main power supply line VL (main), the second layer of aluminum interconnection pattern Al1 is used as the sub power supply line VL (sub), and the first layer of interconnection pattern W of metal having high melting point is used as a local line LL for internal connection in the circuit block 10.

Main power supply line VL (main) is provided between external power supply pad 8 and VDC 9, and also entirely over the DRAM chip from an output node of VDC 9. Sub power supply line VL (sub) is provided between the main power supply line VL (main) and each of the circuit blocks 10.

The external power supply potential extVcc applied to external power supply pad 8 is applied to VDC through the main power supply line VL (main). The internal power supply potential intVcc output from VDC 9 is supplied entirely to the DRAM chip through main power supply line VL (main), and further to each of the circuit blocks 10 through sub power supply line VL (sub). Each circuit block receives the internal power supply potential intVcc and performs a prescribed operation.

In this embodiment, the first layer of interconnection pattern W of metal having high melting point is used as the local line LL, and the second and third layers of aluminum interconnection patterns Al1 and Al2 are used as power supply lines VL (sub) and VL (main). Therefore, resistance of power supply lines VL (sub) and VL (main) can be reduced without increasing the layout area. Since the power supply lines VL (sub) and VL (main) come to have low resistance, floating of potentials at the power supply lines VL (sub) and VL (main) can be prevented, and hence access delay or the like derived from floating potential can be avoided.

Figure 22:
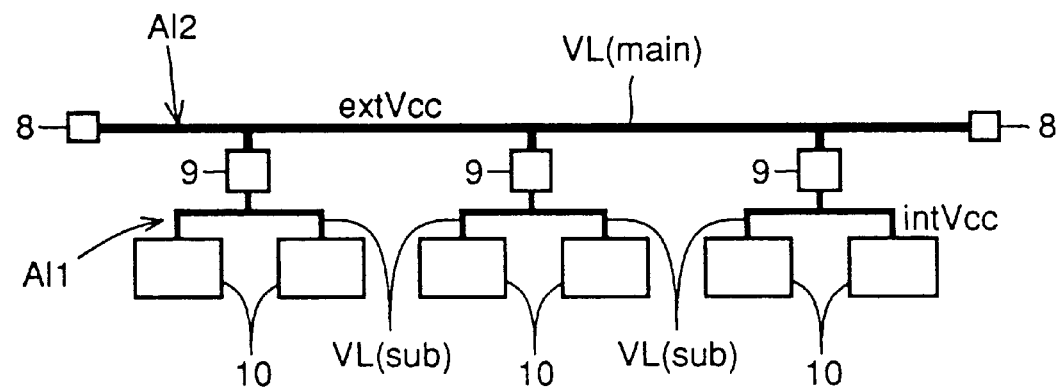
FIG. 22 is a block diagram showing an example of improvement of the eighth embodiment.

Meanwhile, a plurality of VDC 9 may be distributed over the entire area of the DRAM chip as shown in FIG. 22. In that case, main power supply line VL (main) is provided between the external power supply pad 8 and the plurality of VDC 9, and sub power supply line VL (sub) is provided between each VDC 9 and adjacent circuit block 10. The external power supply potential extVcc applied to the external power supply pad 8 is applied to each VDC 9 through the main power supply line VL (main). The internal power supply potential intVcc output from VDC 9 is applied to circuit block 10 through sub power supply line VL (sub).

The same effect as in the embodiment shown in FIG. 21 can be provided also by this structure.

[Embodiment 9]

Figure 23:
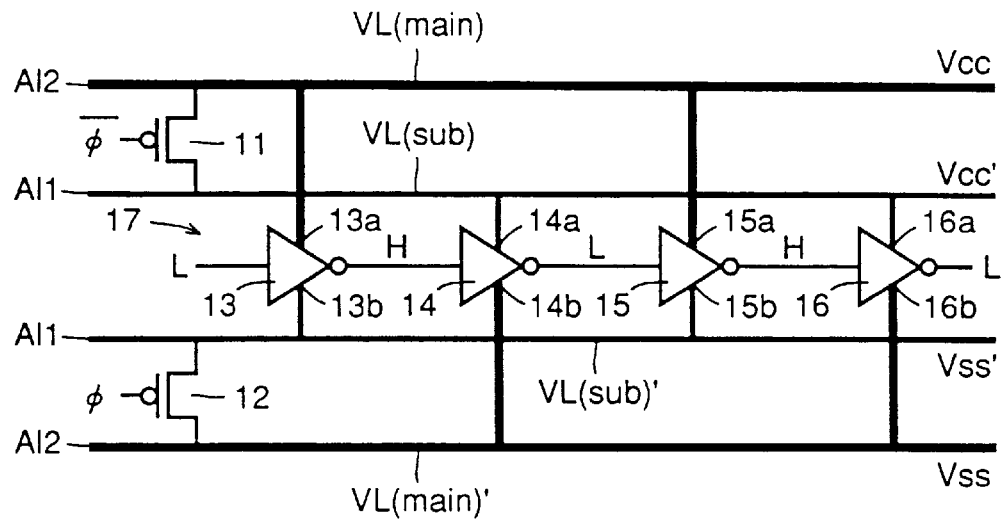
FIG. 23 is a block diagram showing a structure of a DRAM chip in accordance with a ninth embodiment of the present invention.

FIG. 23 is a partial block diagram showing the structure of the DRAM chip in accordance with a ninth embodiment of the present invention. Referring to the figure, the DRAM chip includes an inverter train 17 including four inverters 13 to 16 connected in series, a P channel MOS transistor 11 and an N channel MOS transistor 12 for applying power supply potentials Vcc and Vss to the inverter train 17 in response to activating signals /φ and φ. Power supply potential Vcc is directly applied to positive power supply terminals 13a and 15a of inverters 13 and 15, and power supply potential Vcc is applied through P channel MOS transistor 11 to positive power supply terminals 14a and 16a of inverters 14 and 16. Power supply potential Vss is directly applied to negative power supply terminals 14b and 16b of inverters 14 and 16, and power supply potential Vss is applied through N channel MOS transistor 12 to negative power supply terminals 13b and 15b of inverters 13 and 15.

Inverter train 17 provides a signal at the "L" level when activating signals /φ and φ attain to the active level ("L" level and "H" level) and the input is established as "L" level.

In this circuit, power supply potentials Vcc and Vss are applied to inverter train 17 only when the activating signals /φ and φ attain to the active level, and therefore current is not wasted when the inverter train 17 is not in use. Further, to positive power supply terminals 13a and 15a of inverters 13 and 15 providing "H" level when the input is at "L" level, power supply potential Vcc is directly applied, while to the negative power supply terminals 14b and 16b of inverters 14 and 16 providing "L" level when the input is established to "L" level, the power supply potential Vss is directly applied. Therefore, inverters 13 to 16 operate at high speed.

This circuit itself is disclosed in 1993 Symposium on VLSI Circuit Dig. of Tech Papers pp. 47–48 and pp. 83–84. When the circuit is to be mounted on the DRAM chip, increase in chip area can be prevented by applying the method of layout of the present invention.

More specifically, the third layer, that is, aluminum interconnection pattern Al2 is used as main power supply lines VL (main) and VL (main)', the second aluminum interconnection pattern Al1 is used as sub power supply lines VL (sub) and VL (sub)', and the first layer, that is, interconnection pattern W of metal having high melting point is used as local line LL for internal connection of inverter train 17.

To the main power supply line VL (main), power supply potential Vcc is applied, and the main power supply line VL (main) is connected to positive power supply terminals 13a and 15a of inverters 13 and 15. To the main power supply line VL (main)', power supply potential Vss is applied, and the main power supply line VL (main)' is connected to negative power supply terminals 14b and 16b of inverters 14 and 16. Sub power supply line VL (sub) is connected to positive power supply terminals 14a and 16a of inverters 14 and 16, and sub power supply line VL (sub)' is connected to negative power supply terminals 13b and 15b of inverters 13 and 15. P channel MOS transistor 11 has its source connected to the main power supply line VL (main), its drain connected to the sub power supply line VL (sub), and it receives at its gate the activating signal /φ. N channel MOS transistor 12 has its source connected to the main power supply line VL (main)', its drain connected to the sub power supply line VL (sub)' and it receives at its gate a complementary signal φ of activating signal /φ. In this embodiment, the first layer of interconnection pattern W of metal having high melting point is used as the local line LL for internal connection of inverter train 17, and the second and third layers of aluminum interconnection patterns Al1 and Al2 are used as power supply lines VL (sub), VL (sub)'; VL (main) and VL (main)'. Therefore, as compared with the prior art in which the second layer of aluminum interconnection pattern Al1 is used as the local line LL, the layout area can be reduced and the resistance of the power supply lines can be reduced.

Figure 24:
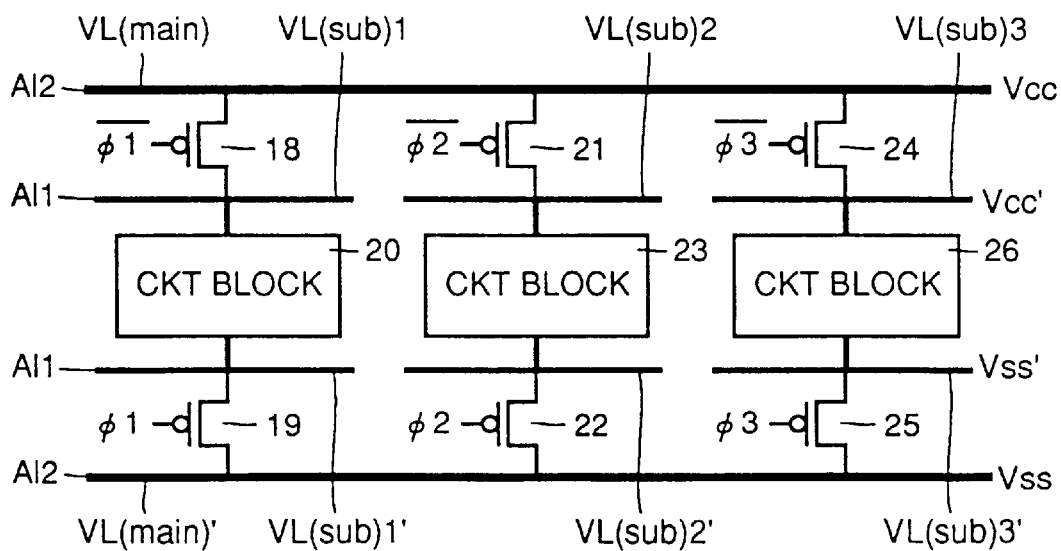
FIG. 24 is a block diagram showing an example of improvement of the ninth embodiment.

Meanwhile, the method of layout of the present invention can also be applied when a circuit including a plurality of (three in the shown example) circuit blocks 20, 23 and 26 and P channel MOS transistors 18, 21, 24 and N channel MOS transistors 19, 22, 25 for applying power supply potentials Vcc and Vss to circuit blocks 20, 23 and 26 is to be mounted on the DRAM chip, as shown in FIG. 24.

In this example, the third layer, that is, aluminum interconnection pattern Al1 is used as main power supply lines VL (main) and VL (main)', the second layer, that is, aluminum interconnection pattern Al2 is used as sub power supply lines VL (sub) 1, VL (sub) 1'; VL (sub) 2, VL (sub) 2'; VL (sub) 3, VL (sub) 3', and the first layer, that is, interconnection pattern W of metal having high melting point is used as the local line LL for internal connection in each of the circuit blocks 20, 23 and 26.

To main power supply lines VL (main) and VL (main)', power supply potentials Vcc and Vss are applied. To sub power supply lines VL (sub) 1, VL (sub) 1'; VL (sub) 2, VL (sub) 2' and VL (sub) 3 and VL (sub) 3' are connected to power supply terminals of circuit blocks 20, 23 and 26, respectively. P channel MOS transistors 18, 21 and 24 have their sources connected together to the main power supply line VL (main), their drains connected to sub power supply lines VL (sub) 1, VL (sub) 2 and VL (sub) 3, respectively, and they receive at their gates, activating signals /φ1, /φ2 and /φ3, respectively. N channel MOS transistors 19, 22 and 25 have their sources connected to the main power supply line VL (main)', their drains connected to sub power supply lines VL (sub) 1', VL (sub) 2' and VL (sub) 3' respectively, and they receive at their gates, complementary signals φ1, φ2 and φ3 of activating signals /φ1, /φ2 and /φ3, respectively.

In this case also, the layout area can be reduced and the resistance of the power supply line can be reduced.

Though the first, second and third layers are interconnection pattern W of metal having high melting point, aluminum interconnection pattern Al1 and aluminum interconnection pattern Al2, respectively, in the above described embodiments 1 to 9, all these three layers may be aluminum interconnection patterns. In that case, the first layer is preferably be used as the local line, the second layer as the power supply line and the third layer as the bus signal line.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit formed on a semiconductor substrate, comprising:
    a logic circuit including a plurality of transistor elements provided on a prescribed area of a surface of said semiconductor substrate, and a local line for coupling between said plurality of transistor elements, said local line formed by a first interconnection pattern provided above said plurality of transistor elements;
    a signal line for transmitting a signal between said logic circuit and other circuit, said signal line formed by a second interconnection pattern provided above said first interconnection pattern, said signal line and prescribed area overlapping;
    a power supply line for supplying power supply potential to said logic circuit, said power supply line formed by a third interconnection pattern provided above said second interconnection pattern, said power supply line and said prescribed area overlapping;
    a memory array region including a plurality of memory cells arranged in rows and columns on a surface of said semiconductor substrate, and a plurality of bit line pairs corresponding to said columns of the memory cells respectively,
    said first interconnection pattern being used as said bit line pairs, and thinner than said second interconnection pattern such that the capacitance of said bit line pairs are reduced, a resistivity of a material forming said first interconnection pattern being smaller than the resistivity of tungsten silicide,
    said second interconnection pattern being thinner than said third interconnection pattern, and
    said signal line and said power supply line extending in the same direction, wherein the power supply line extends above the signal line with no intervening conductive line therebetween.

2. The semiconductor integrated circuit according to claim 1, further comprising:
    a contact electrode coupled to said power supply line and formed by said second interconnection pattern;
    a local line formed by said first interconnection pattern and coupled between said contact electrode and said logic circuit, for supplying said power supply potential to said logic circuit.

3. The semiconductor integrated circuit according to claim 1, further comprising:
    a local line formed by said first interconnection pattern and connected to said signal line via a through hole provided in said prescribed area, for transmitting said signal to said logic circuit.

4. The semiconductor integrated circuit according to claim 1, further comprising:
    a signal line for transmitting a signal between said logic circuit and other circuit, said signal line formed by a second interconnection pattern provided above said first interconnection pattern, said signal line provided outside said prescribed area;
    a local line formed by said first interconnection pattern, extended outside said prescribed area, and connected to said signal line via a through hole provided outside said prescribed area, for transmitting said signal to said logic circuit.

5. The semiconductor integrated circuit according to claim 1, wherein said local line is formed of tungsten, and said signal line and power supply line are formed of aluminum.

6. The semiconductor device according to claim 1, wherein:
    said prescribed area is defined by first substantially parallel sides extending in a first direction and second substantially parallel sides, shorter than the first substantially parallel sides, extending in a second direction substantially perpendicular to the first direction;
    said local line extends substantially parallel to the second direction; and
    said signal line and said power supply line extend substantially parallel to the first direction.

7. A semiconductor integrated circuit formed on a semiconductor substrate, comprising:
    a plurality of semiconductor element groups provided on a surface of said semiconductor substrate, each performing a prescribed operation;
    a first interconnection pattern provided above said plurality of semiconductor element groups, used as a local line for connecting semiconductor elements in each of said semiconductor element groups;
    a second interconnection pattern provided above said first interconnection pattern;
    a third interconnection pattern provided above said second interconnection pattern; and
    a memory array region including a plurality of memory cells arranged in rows and columns on a surface of said semiconductor substrate, and a plurality of bit line pairs corresponding to said columns of the memory cells respectively,
    said first interconnection pattern being used as said bit line pairs, and thinner than said second interconnection pattern,
    said second interconnection pattern being thinner than said third interconnection pattern, wherein
    said second interconnection pattern is used as a lower layer signal line for signal input/output between each of said semiconductor element groups and a portion in the substrate other than the semiconductor element group;
    said third interconnection pattern is used as an upper layer power supply line for applying a power supply potential to each of said semiconductor element groups;
    the lower layer signal line and the upper layer power supply line extend parallel to each other;
    the local line extends orthogonal to the lower layer signal line and the upper layer power supply line;
    said second interconnection pattern is further used as a contact electrode for connecting said upper layer power supply line with each of said semiconductor element groups; and with no intervening conductive pattern between the lower layer signal line and third interconnection pattern.

8. The semiconductor integrated circuit according to claim 7, wherein said first, second and third interconnection patterns are formed of aluminum.

9. The semiconductor integrated circuit according to claim 7, wherein said first interconnection pattern is formed of a metal having high melting point, and said second and third interconnection patterns are formed of aluminum.

10. The semiconductor device according to claim 9, wherein the high melting point metal is tungsten.

11. The semiconductor integrated circuit according to claim 1, wherein each of said plurality of semiconductor element groups includes a plurality of semiconductor elements of first and second conductivity types, and said first interconnection pattern connects the semiconductor elements of said first conductivity type in each of said semiconductor element groups.

12. The semiconductor integrate circuit according to claim 7, wherein:

said plurality of semiconductor element groups are formed in a region defined by first substantially parallel sides extending in a first direction and second substantially parallel sides, shorter than the first sides, extending in a second direction substantially perpendicular to the first direction;

said local line extends substantially parallel to the second direction;

said lower layer signal line extends substantially parallel to the first direction; and said upper layer power supply line extends substantially parallel to the first direction.

* * * * *